United States Patent
Lee et al.

(10) Patent No.: US 10,969,832 B2
(45) Date of Patent: Apr. 6, 2021

(54) DISPLAY DEVICE

(71) Applicant: Samsung Display Co., Ltd., Yongin-Si (KR)

(72) Inventors: Kang Won Lee, Yongin-si (KR); Hee Woong Park, Yongin-si (KR); Jeong Heon Lee, Yongin-si (KR); Won Gu Cho, Yongin-si (KR); Mu Gyeom Kim, Yongin-si (KR); Choon Hyop Lee, Yongin-si (KR); Seung Lyong Bok, Yongin-si (KR)

(73) Assignee: Samsung Display Co., Ltd.

( * ) Notice: Subject to any disclaimer, the term of this patent is extended or adjusted under 35 U.S.C. 154(b) by 0 days.

(21) Appl. No.: 16/705,094

(22) Filed: Dec. 5, 2019

(65) Prior Publication Data

US 2020/0110501 A1   Apr. 9, 2020

Related U.S. Application Data

(62) Division of application No. 15/337,994, filed on Oct. 28, 2016, now Pat. No. 10,534,459.

(30) Foreign Application Priority Data

Mar. 22, 2016 (KR) .......................... 10-2016-0034308

(51) Int. Cl.
*G06F 1/16* (2006.01)
*G06F 3/041* (2006.01)
*G06F 3/044* (2006.01)

(52) U.S. Cl.
CPC .......... *G06F 1/1686* (2013.01); *G06F 3/0412* (2013.01); *G06F 3/0443* (2019.05); *G06F 3/0446* (2019.05); *G06F 3/04164* (2019.05); *G06F 2203/04111* (2013.01); *G06F 2203/04112* (2013.01)

(58) Field of Classification Search
CPC ................... G06F 3/0412; G06F 3/044; G06F 2203/04111; G06F 2203/04112
See application file for complete search history.

(56) References Cited

U.S. PATENT DOCUMENTS 9,030,839 B2 * 5/2015 Leggett .................... H01H 9/02
                                                                361/781
9,788,420 B2 * 10/2017 Araki ..................... B32B 27/325
9,989,792 B2 * 6/2018 Hao .................. G02F 1/133308
(Continued)

FOREIGN PATENT DOCUMENTS

CN     102338945 A    2/2012
CN     202145301 U    2/2012
(Continued)

OTHER PUBLICATIONS

Ohinese Office Action Report, Application No. 201710168950.9 dated Mar. 1, 2021, 8 pages.

*Primary Examiner* — Sejoon Ahn
(74) *Attorney, Agent, or Firm* — Innovation Counsel LLP

(57) ABSTRACT

A display device including a display panel for displaying an image on a front surface of the display panel; a touch sensing unit provided on the display panel to sense a touch; an insulating film covering the touch sensing unit; a first circuit board of which one end is connected to the touch sensing unit; and a polarizing layer covering the touch sensing unit and a portion of the first circuit board.

15 Claims, 18 Drawing Sheets

(56) References Cited

U.S. PATENT DOCUMENTS

| | | | | |
|---|---|---|---|---|
| 2002/0089493 A1* | 7/2002 | Hong | G06F 3/041 | 345/173 |
| 2003/0052867 A1* | 3/2003 | Shigetaka | G06F 3/044 | 345/173 |
| 2004/0263670 A1* | 12/2004 | Yamasaki | H01L 27/3234 | 348/340 |
| 2009/0290089 A1* | 11/2009 | Ichioka | G02F 1/133308 | 349/58 |
| 2010/0060601 A1* | 3/2010 | Oohira | G06F 3/0412 | 345/173 |
| 2010/0134439 A1* | 6/2010 | Ito | G06F 3/0416 | 345/174 |
| 2010/0309150 A1* | 12/2010 | Lee | G06F 3/0412 | 345/173 |
| 2011/0193801 A1* | 8/2011 | Jung | G06F 3/044 | 345/173 |
| 2011/0285640 A1* | 11/2011 | Park | G06F 3/0412 | 345/173 |
| 2012/0045086 A1* | 2/2012 | Su | G06F 1/1643 | 381/388 |
| 2012/0146919 A1 | 6/2012 | Kim et al. | | |
| 2012/0188196 A1 | 7/2012 | Liu et al. | | |
| 2013/0039092 A1* | 2/2013 | Cho | G02B 6/009 | 362/612 |
| 2013/0044074 A1 | 2/2013 | Park et al. | | |
| 2013/0082942 A1* | 4/2013 | Yu | G06F 3/0412 | 345/173 |
| 2013/0088281 A1* | 4/2013 | Wang | G06F 3/045 | 327/517 |
| 2013/0162581 A1* | 6/2013 | Ujii | G06F 3/016 | 345/173 |
| 2013/0279063 A1* | 10/2013 | Yoo | H05F 3/00 | 361/220 |
| 2013/0285978 A1* | 10/2013 | Wang | G06F 1/1643 | 345/174 |
| 2013/0308290 A1* | 11/2013 | Wang | G06F 3/044 | 361/818 |
| 2014/0022208 A1 | 1/2014 | Wu | | |
| 2014/0049983 A1* | 2/2014 | Nichol | G02B 6/0028 | 362/610 |
| 2014/0078414 A1 | 3/2014 | Lee | | |
| 2014/0098035 A1* | 4/2014 | Huang | G06F 3/041 | 345/173 |
| 2014/0218639 A1* | 8/2014 | Lin | G02F 1/13338 | 349/12 |
| 2015/0316806 A1* | 11/2015 | Chang | G06F 3/044 | 345/174 |
| 2016/0147346 A1* | 5/2016 | Lee | G06F 3/044 | 345/173 |
| 2016/0178277 A1* | 6/2016 | Park | H03K 17/962 | 345/173 |

FOREIGN PATENT DOCUMENTS

| | | |
|---|---|---|
| CN | 102662522 A | 9/2012 |
| CN | 103425313 A | 12/2013 |
| CN | 104793789 A | 7/2015 |
| KR | 10-2013-0002120 A | 1/2013 |

* cited by examiner

FIG. 13
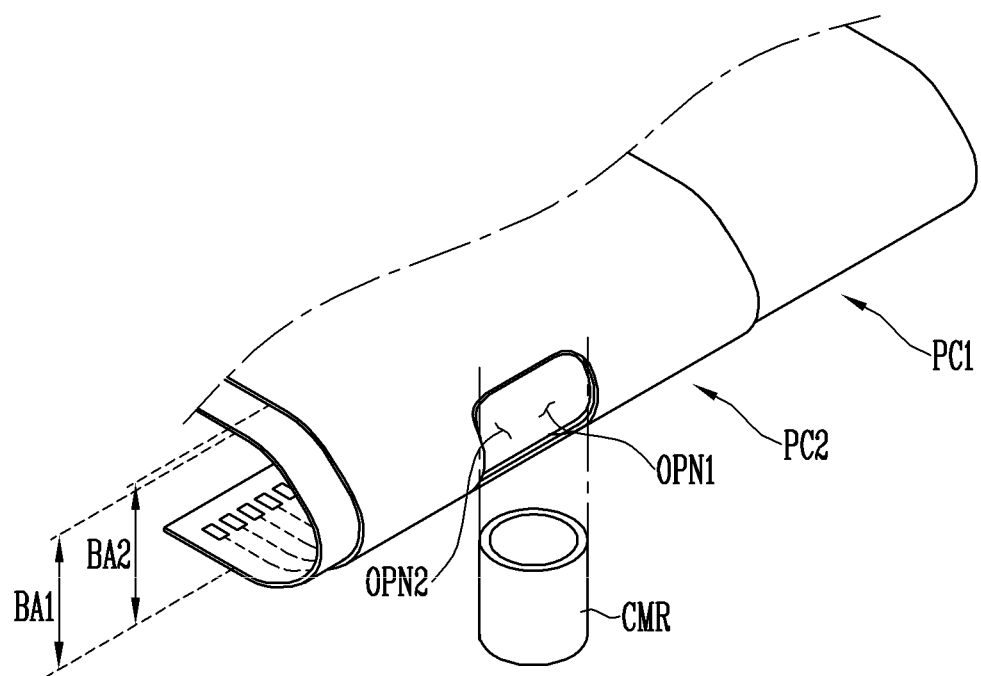
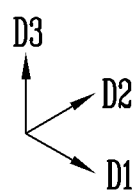

US 10,969,832 B2

DISPLAY DEVICE

CROSS-REFERENCE TO RELATED APPLICATION(S)

This application is a divisional application of U.S. patent application Ser. No. 15/337,994 filed Oct. 28, 2016, which claims priority to and the benefit of Korean Patent Application No. 10-2016-0034308 filed on Mar. 22, 2016, in the Korean Intellectual Property Office, the disclosure of which is incorporated herein in its entirety by reference.

BACKGROUND

Field

Embodiments of the present disclosure relate to a display device, and more particularly, to a display device applicable to a mobile electronic device and/or to a stationary electronic device.

Description of the Related Art

Due to the recent trends of producing mobile terminals that provide increasingly varied functions, mobile terminals are being equipped with various input devices and/or various output devices such as a touch screen, a camera, a sensor, and the like.

For example, most mobile terminals are equipped with a display device having a touch panel and a display panel. The touch panel carries out the functions of an input device while the display panel carries out the functions of an output device. Each of the display panel and the touch panel is connected to a circuit board through films, for example, a chip on film (COF) or a flexible flat cable (FFC).

SUMMARY

A purpose of the present invention is to provide a display device having reduced defects, more specifically, to a display device having reduced bubble defects.

According to an embodiment of the present disclosure, a display device includes a display panel for displaying an image on a front surface of the display panel; a touch sensing unit provided on the display panel to sense a touch; an insulating film to cover the touch sensing unit; a first circuit board of which an end is connected to the touch sensing unit; and a polarizing layer covering the touch sensing unit and a portion of the first circuit board. The insulating film is spaced apart from the end of the first circuit board by as much as 0 to 0.1 mm in plan view.

The display device may further include an adhesive provided between the polarizing layer and the touch sensing unit and the portion of the first circuit board.

The insulating film and the first circuit board may be in contact with each other.

In the embodiment of the present disclosure, the first circuit board may have a first opening.

According to another embodiment of the present disclosure, a display device may include a display panel for displaying an image on a front surface of the display panel; a touch sensing unit provided on the display panel to sense a touch; an insulating film to cover an upper surface of the touch sensing unit; a first circuit board having a first opening and an end is connected to the touch sensing unit; a compensation pattern provided between the insulating film and one end of the first circuit board when seen from a plan view, and having a predetermined height; and a polarizing layer covering the touch sensing unit and a portion of the first circuit board.

In an embodiment of the present disclosure, the predetermined height of the compensation pattern may be more than a height of the insulating film from the upper surface of the touch sensing unit but may be less than a height of the first circuit board.

The display device may further comprise a second circuit board board having a second opening and an end which is connected to the display panel. The first circuit board and the second circuit board may have flexibility, and are bent so that another end of the first circuit board and another end of the second circuit board are disposed on a rear surface of the display panel.

According to another embodiment of the present disclosure, a display device includes a display panel for displaying an image on a front surface of the display panel; a touch sensing unit provided on the display panel to sense a touch; an insulating film covering an upper surface of the touch sensing unit; a first circuit board having a first opening an end which is connected to the touch sensing unit and; and a polarizing layer covering the touch sensing unit and a portion of the first circuit board. The first circuit board may have a cavity that connects a side portion of the insulating film with an exterior of the insulating film.

The cavity may comprise a plurality of cavities.

The substrate may have a recess in a position corresponding to the first opening. The first pad portion may further include first pads provided at both sides of the recess, and first dummy pads provided between the first pads provided at the both sides of the recess.

The first circuit board may include a second pad portion corresponding to the first pad portion.

The second pad portion may include second pads corresponding to the first pads provided at the both sides of the recess, and second dummy pads corresponding to the first dummy pads.

The cavity may be provided between the second dummy pads.

In an embodiment of the present disclosure, the cavity may be a groove formed on a lower surface of the first circuit board, or the cavity may be a hole that penetrates an upper surface and a lower surface of the first circuit board.

In the aforementioned embodiments of the present disclosure, the display device may further include an adhesive provided between the polarizing layer and the touch sensing unit and the portion of the first circuit board.

In the aforementioned embodiments of the present disclosure, the touch sensing unit may include a substrate; a touch sensor provided on the substrate; a wiring connected to the touch sensor; and a first pad portion connected to the wiring, and the insulating film may cover the touch sensor and the wiring. In this case, the first circuit board may overlap the first pad portion.

The first circuit board may include a second pad portion corresponding to the first pad portion.

In the aforementioned embodiments of the present disclosure, the first circuit board may have flexibility, and may be bent so that another end of the first circuit board is disposed on a rear surface of the display panel.

In the aforementioned embodiments of the present disclosure, the display device may further include a second circuit board of which an end is connected to the display panel. The second circuit board may further have a second opening. The first circuit board may have flexibility, and may be bent so that another end of the second circuit board is disposed on a rear surface of the display panel. The second circuit board may have flexibility, and may be bent so that another end of the second circuit board is disposed on a rear surface of the display panel.

The first opening and the second opening may be provided in positions corresponding to each other.

According to the aforementioned embodiments of the present disclosure, a display device with significantly reduced bubble defects is provided.

BRIEF DESCRIPTION OF THE DRAWINGS

Embodiments are described hereinafter with reference to the accompanying drawings. However, the present disclosure may be embodied in different forms and is not limited to the embodiments set forth herein. Rather, these embodiments are provided as examples to facilitate the understanding of the present teachings by those of ordinary skill in the art.

In the drawings, the dimensions of the figures may be exaggerated for clarity of illustration. When an element is referred to as being "between" two elements, the element may be the only element present between the two elements, or one or more intervening elements may also be present.

FIG. 13 is a view illustrating a portion of the display device and a position of the camera of the electronic device according to the embodiment of the present disclosure.

DETAILED DESCRIPTION

Figure 1:
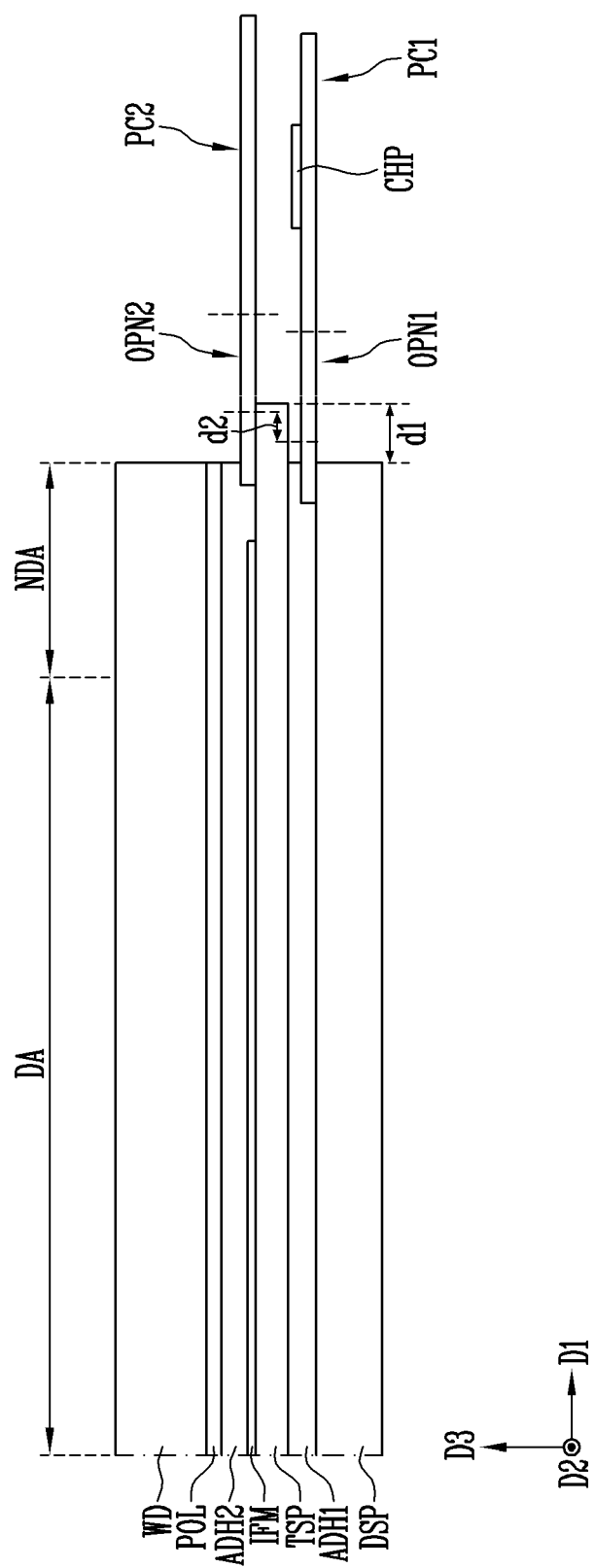
FIG. 1 is a cross-sectional view of a display device according to an embodiment of the present disclosure in an electronic device.

Hereinafter, the present disclosure will be explained in detail so that it could be easily implemented by those skilled in the related art. The present disclosure can be embodied in various different forms, without limitation to the embodiments set forth herein.

Features that are not related to the present disclosure are omitted for clarity's sake, and like reference numerals are used to indicate like or similar components.

Furthermore, the size and thickness of each component shown in the drawings are selected for convenience's sake, but without limiting the present disclosure. The thickness of each layer and area may be magnified for clarity's sake. In the drawings, some of the thicknesses of the layers and areas are exaggerated for convenience's sake, not necessarily drawn to scale.

Furthermore, when a layer, a film, an area, or a panel, etc. is described as being "on" or "above" another layer, film, area, or panel, etc., it may be directly "on" or directly "above" another layer, film, area, or panel, etc., or indirectly "on" or indirectly "above" another layer, film, area, or panel, etc. However, when a layer, a film, an area, or a panel, etc. is described as being "directly on" or "directly above" another layer, film, area, or pane, etc., it is "directly on" or "directly above" another layer, film, area, or panel, etc., with no other component disposed therebetween. Furthermore, when a component is described as being "above" or "on" another component, the component may be disposed above or below another component. That is, it does not necessarily mean that the component is "above" or "on" another component in any specific direction.

Furthermore, in the entirety of this specification, when a component is described as "including" or "comprising" another component, the component may include or comprise other components in addition to the component that is specifically mentioned.

Furthermore, in the entirety of this specification, when a component is described as being in a certain condition "when seen from a plan view", it means that the component appears to be in that condition when seen from the top, and when a component is described as being in a certain condition "when seen from a cross-sectional view", it means that the component appears to be in that condition when cut vertically and seen from the side.

An embodiment of the present disclosure relates to an electronic device, for example a mobile electronic device. Examples of the electronic device according to the embodiment of the present disclosure include a mobile phone, a smart phone, a laptop computer, a digital broadcasting terminal, a personal digital assistant (PDA), a portable multimedia player (PMP), a navigation, a slate PC, a tablet PC, a wearable device (for example, a smartwatch, a smart glass, a head mounted display (HMD)), and the like: basically, having a display device for displaying images. Besides the aforementioned, the electronic device may further include an additional input device such as a camera, a keyboard, a microphone, and the like, and/or an output device such as a speaker, a printer, and the like.

The embodiments of the present disclosure may obviously be applied to a stationary electronic device such as a digital TV, a desktop computer, a digital signage and the like, and not just to a mobile electronic device.

Figure 2:
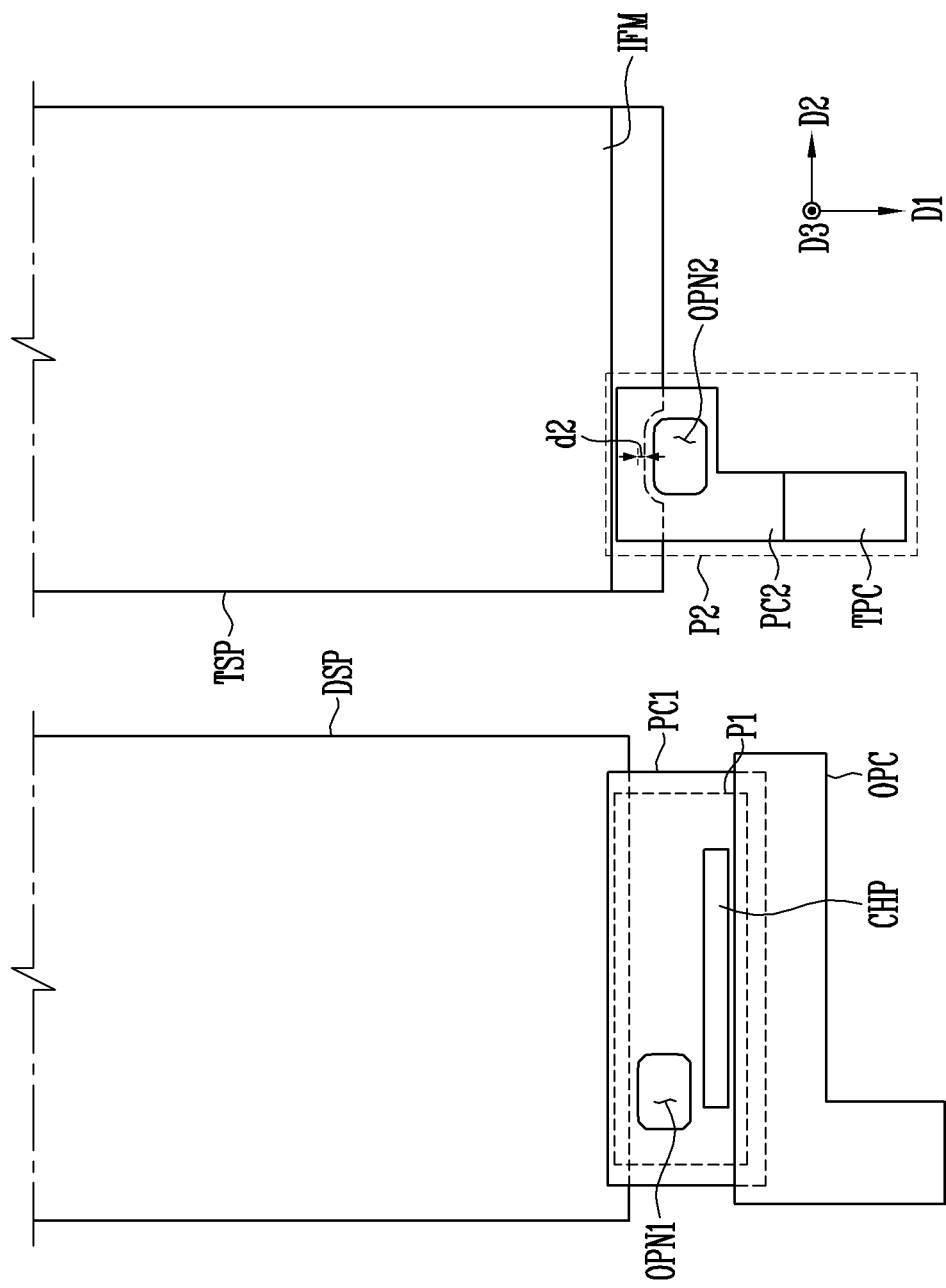
FIG. 2 is a plan view schematically illustrating a connection relationship between a display panel, a touch sensing unit, an operating circuit board, and a touch circuit board of the display device according to the embodiment of the present disclosure in an electronic device.

FIG. 1 is a cross-sectional view of a display device according to an embodiment of the present disclosure in an electronic device. FIG. 2 is a plan view schematically illustrating a connection relationship between a display panel DSP, a touch sensing unit TSP, an operating circuit board PC1 and a touch circuit board PC2 of the display device according to the embodiment of the present disclosure in an electronic device.

Referring to FIGS. 1 and 2, the display device according to an embodiment of the present disclosure includes the display panel DSP, the touch sensing unit TSP provided on the display panel DSP having a first adhesive ADH1 between the display panel DSP and the touch sensing unit TSP and configured to sense a touch, and an insulating film IFM covering the touch sensing unit TSP. On the touch sensing unit TSP, a polarizing layer POL may be provided having a second adhesive ADH2 between the touch sensing unit TSP and the polarizing layer POL, and further, a window WD may be provided on the polarizing layer POL. In the embodiment of the present disclosure, the operating circuit board PC1 may be connected to the display panel DSP, and the touch circuit board PC2 may be connected to the touch sensing unit TSP.

The components illustrated in FIG. 1 are not essential in embodying the display device; that is, as will be explained hereinafter, the display device may have more components or less components than the components listed above.

The display panel DSP includes a display area DA for displaying images and a non-display area NDA provided in at least one side of the display area DA. The display panel DSP has a front surface on which images are provided and a rear surface that is opposite to the front surface.

The display panel DSP according to an embodiment of the present disclosure may be provided in various forms, for example, in a rectangular panel form having two pairs of sides, each pair of sides parallel to each other. In the case where the display panel DSP is provided in such a rectangular panel form, one of the two pairs of sides may be longer than the other pair of sides. Hereinafter, explanation will be made based on an assumption that the display panel DSP according to the embodiment of the present disclosure has a rectangular form having one pair of long sides and one pair of short sides, the long sides extending in a first direction D1 and the short sides extending in a second direction D2. A third direction D3 means a direction that is vertical to a plane formed by the first direction D1 and the second direction D2.

However, the display panel DSP is not limited to the aforementioned form. For example, one side of the display panel DSP may be protruding or recessed, and at least one side or at least one vertex portion may be substituted by a curve line having a certain curvature. In an embodiment of the present disclosure, the display panel DSP may be provided in various forms, for example, in a closed polygonal form that includes straight sides, a circular or an elliptical form that includes a side made of a curve, a semi-circular or an elliptical form that includes a side made of a straight line and a side made of a curve, etc.

The operating circuit board PC1 may be disposed on the display panel DSP. The operating circuit board PC1 overlaps a portion of the display panel DSP when seen from a plan view. Specifically, one end of the operating circuit board PC1 may overlap the non-display area NDA of the display panel DSP when seen from a plan view.

The operating circuit board PC1 may have flexibility, and may thus be bent. Referring to FIG. 1, it is illustrated that the operating circuit board PC1 extends at length along a direction parallel to the display panel DSP, but this is for convenience's sake. That is, the operating circuit board PC1 may be bent such that it covers an edge of the display panel DSP along a side portion of the display panel DSP, and accordingly, another end of the operating circuit board PD1 may be disposed on a rear surface of the display panel DSP.

The operating circuit board PC1 may be a flexible printed circuit board FPCB or a chip on film COF. In an embodiment of the present disclosure, the operating circuit board PC1 may be equipped with an integrated circuit chip CHP, the operating circuit board PC1 being a chip on film COF.

The operating circuit board PC1 may have at least one first opening OPN1. When the operating circuit board PC1 is curved in a rear direction of the display panel DSP, the first opening OPN1 may be curved as well.

The first opening OPN1 may be provided as a plurality of first openings OPN1 each disposed in a certain position for each of a plurality of electronic components. However, explanation herein is made based on an assumption that the operating circuit board PC1 according to the embodiment of the present disclosure has only one first opening OPN1. Explanation of an arrangement relationship between the first opening OPN1 and the electronic components will be made later on.

Above the display panel DSP and the operating circuit board PC1, the first adhesive ADH1 may be disposed. The first adhesive ADH1 may be a transparent adhesive or a transparent cohesive agent having high light transmittance. Examples of the transparent adhesive that may be used herein include resin and optical clear adhesive OCA. The first adhesive ADH1 may be used to attach the display panel DSP and the touch sensing unit TSP to each other.

The touch sensing unit TSP senses a touch made by a user. Examples of such a touch include a slight contact made by the user and a touch of the intensity of applying a certain pressure.

The touch sensing unit TSP may overlap the display panel DSP when seen from a plan view. The touch sensing unit TSP may be disposed on at least one of the front surface or the rear surface of the display panel DSP. In an embodiment of the present disclosure, the display panel DSP may be disposed on the front surface of the display panel DSP.

The touch made by the user on the touch sensing unit TSP may be made by a hand of the user or through use of a tool such as a stylus pen, or the like, configured to input a touch. The touch sensing unit TSP may be attached to the display panel DSP using the first adhesive ADH1.

The touch sensing unit TSP may include a touch area configured to receive a touch input and a non-touch area that does not receive a touch input. The touch area may overlap the display area DA of the display panel DSP, and the non-touch area may overlap the non-display area NDA of the display panel DSP. The touch area and the display area DA may have different surface areas and/or different forms from each other, and the non-touch area and the non-display area NDA may have different surface areas and/or different forms from each other. However, explanation herein is based on an example where the touch area and the display area DA have an identical form and an identical surface area, and explanation on the touch area and the non-touch area may be substituted by the explanation on the display area DA and the non-display area NDA.

In the non-display area NDA, one end of the touch sensing unit TSP may extend in the first direction D1 further than one end of the display panel DSP. For example, the one end of the touch sensing unit TSP may extend by as much as a first predetermined distance d1 further than the one end of the display panel DSP.

On the touch sensing unit TSP, an insulating film IFM is provided. The insulating film IFM covers an upper surface of the touch sensing unit TSP. In particular, the insulating film IFM may cover the display area DA of the touch sensing unit TSP to protect the touch sensing unit TSP, and may cover most of the non-display area NDA except for a first pad portion that will be explained later on, thereby protecting a routing line and the like.

The touch circuit board PC2 may be disposed above the touch sensing unit TSP. The touch circuit board PC2 overlaps a portion of the touch sensing unit TSP in an area where the insulating film IFM is not provided when seen from a plan view. Specifically, when seen from a plan view, the touch circuit board PC2 may overlap the touch sensing unit TSP in at least a portion of the non-display area NDA of the touch sensing unit TSP, specifically, in an area corresponding to the first pad portion that will be explained later on.

In an embodiment of the present disclosure, the touch circuit board PC2 may not be spaced apart from the insulating film IFM. Alternatively, if the touch circuit board PC2 is spaced apart from the insulating film IFM, it may be spaced apart from the insulating film IFM by a distance of 0.1 mm or less. This arrangement will be explained in more detail later on.

The touch circuit board PC2 may have flexibility, and may thus be bent. Referring to FIG. 1, it is illustrated that the touch circuit board PC2 extends at length along a direction parallel to the touch sensing unit TSP, but this is for convenience's sake, that is, the touch circuit board PC2 may be bent such that it covers an edge of the display panel DSP along a side portion of the display panel DSP, and accordingly, another end of the flexible circuit board may be disposed on a rear surface of the display panel DSP.

The touch circuit board PC2 may be a flexible printing circuit board FPCB or a chip on film COF. In the embodiment of the present disclosure, the touch circuit board PC2 may be a flexible printing circuit board that does not include an integrated circuit chip.

The touch circuit board PC2 may include at least one second opening OPN2. The second opening OPN2 of the touch circuit board PC2 may be disposed in a position corresponding to the position of the first opening OPN1. In this case, an edge of the second opening OPN2 may be spaced apart from its corresponding edge of the first opening OPN1 by a second distance d2 along the first direction D1.

When the touch circuit board PC2 is curved in a rear direction of the display panel DSP, the second opening OPN2 may be curved in a manner similar to the first opening OPN1. In the curved second opening OPN2, components of the electronic device may be positioned.

The second opening OPN2 may be provided as a plurality of second openings OPN2s. Furthermore, the second opening OPN2 may be provided as a number of second openings OPN2s corresponding to the number of the first opening OPN1. Explanation herein is based on an assumption that the touch circuit board PC2 has one second opening OPN2. Furthermore, explanation on an arrangement relationship between the second opening OPN2 and the electronic components will be made later on.

The polarizing layer POL may be disposed above the touch sensing unit TSP having the second adhesive ADH2 between the touch sensing unit TSP and the polarizing layer POL. The second adhesive ADH2 may be a transparent adhesive or a transparent cohesive agent. Examples of the adhesive herein include resin and optical clear adhesive OCA. The second adhesive ADH2 may be used to attach the touch sensing unit TSP and the polarizing layer POL to each other.

The polarizing layer POL may absorb light being reflected from a surface of the display panel DSP or the touch sensing unit TSP from among light entering from outside. In the embodiment of the present disclosure, the touch sensing unit TSP may be disposed between the display panel DSP and the polarizing layer POL so as to prevent a touch sensing structure from being seen through and to minimize the reflectivity.

Furthermore, in order to improve the strength and robustness of the device, a window WD may be provided above the polarizing layer POL. This window WD may be omitted if the device is sufficiently strong without the window WD. The window WD may be made of a transparent organic polymer, for example, polystyrene, polyvinylalcohol, polymethylmethacrylate, polyethersulfone, polyacrylate, polyetherimide, polyethylene naphthalate, polyethylene terephthalate, polypenylene sulfide, polyarylate, polyimide, polycarbonate, triacetate cellulose, and celluloseacetate propionate, etc.

The polarizing layer POL and the window WD may be provided to correspond to the size and/or form of the display panel DSP and the touch sensing unit TSP. For example, in an embodiment of the present disclosure, the polarizing layer POL and the window WD may be provided in substantially a same size and/or a same form as the touch sensing unit TSP, in which case the polarizing layer POL and the window WD may completely overlap the touch sensing unit TSP.

Hereinafter, an explanation will be provided on the display panel DSP and on the touch sensing unit TSP according to an embodiment of the present disclosure with reference to FIG. 2 again.

One end of the touch sensing unit TSP may extend by as much as the first predetermined distance d1 further than the one end of the display panel DSP along the first direction D1. The touch circuit board PC2 coupled to one end of the touch sensing unit TSP may be bent in the rear direction of the display panel DSP. In the case where the touch sensing unit TSP is shorter than the display panel DSP in the first direction D1 or where the touch sensing unit TSP has a same length as the display panel DSP, the touch circuit board PC2 must have at least a length of a thickness of the first adhesive ADH1 and a thickness of the display panel DSP combined. However, in the case where the touch sensing unit TSP is longer than the display panel DSP by as much as the first distance d1 in the first direction D1, the touch circuit board PC2 has at least a length of the first distance d1 subtracted from the thickness of the first adhesive ADH1 and the display panel DSP. In the case where the touch sensing unit TSP is longer than the display panel DSP by as much as the first distance d1 in the first direction D1, the length of the touch circuit board PC2 is reduced, thereby providing an effect of preventing the touch circuit board PC2 from being damaged by an impact from outside, and also reducing the manufacturing cost of the touch circuit board PC2.

The operating circuit board PC1 coupled with the display panel DSP may have the first opening OPN1. The operating circuit board PC1 may have an integrated circuit chip CHP inside therein. Although it was explained with reference to FIGS. 1 and 2 that the integrated circuit chip CHP is disposed on the upper surface of the operating circuit board PC1, the integrated circuit chip CHP may be disposed on a lower surface of the operating circuit board PC1 or in an inner area of the operating circuit board PC1 instead.

The position of the first opening OPN1 and the integrated circuit chip CHP may vary depending on the position of the electronic components of the electronic device.

The first opening OPN1 illustrated as being in a plane form may be changed to an arbitrary form. For example, the first opening OPN1 may have a circular form, an elliptical form, a polygonal form, or a polygonal form having a circular portion. The first opening OPN1 may have a shape with a curved section. Examples of the polygonal form in which the first opening OPN1 may be embodied include a square, a pentagon, a hexagon, and an octagon, etc. The first opening OPN1 illustrated as having a planar shape and/or the surface area of the first opening OPN1 when seen from a plan view may be changed to another shape and/or surface area, etc. Hereinafter, explanation will be made based on an assumption that the plane is a plane formed by the first direction D1 and the second direction D2.

The integrated circuit chip CHP may transmit an operating signal to the display panel DSP. In this case, the operating signal being output from the integrated circuit chip CHP may be transmitted to the display panel DSP through an operating pad portion OPP in FIG. 3. For example, the integrated circuit chip CHP may be a scan operating circuit that generates a scan signal or a data operating circuit that generates a data signal.

Explanation on the display panel DSP and the operating circuit board PC1 connected to the display panel DSP will be made later on with reference to FIGS. 3 and 4.

The operating circuit board OPC may be coupled to the operating circuit board PC1. The operating circuit board OPC may be disposed on the rear surface of the display panel DSP as the operating circuit board PC1 is bent.

The operating circuit board OPC may include an operating circuit (not illustrated) that operates the display panel DSP. For example, a signal controller may be mounted onto the operating circuit board OPC. The signal controller may generate a control signal for controlling an image being embodied in the display panel DSP, and the control signal may be provided to the integrated circuit chip CHP through the operating circuit board PC1. Furthermore, a plurality of electronic components for controlling various functions of the electronic device according to the embodiment may be further mounted onto the operating circuit board OPC. For example, a camera module, a speaker module, and a memory module, etc., configured to operate in an interlocked manner with the display panel, may be mounted onto the operating circuit board OPC. According to an embodiment of the present disclosure, the operating circuit board OPC may be made as a flexible printing circuit board FPCB.

The touch circuit board PC2 coupled to the touch sensing unit TSP has the second opening OPN2. The position of the second opening OPN2 may vary depending on the position of the first opening OPN1.

The second opening OPN2 illustrated as being in a plane form may be changed to an arbitrary form. For example, the second opening OPN2 may have a circular form, an elliptical form, a polygonal form, or a polygonal form with a circular portion. The second opening OPN2 may have a shape with a curved portion. Examples of the polygonal form in which the second opening OPN2 may be embodied include a square, a pentagon, a hexagon, and an octagon, etc.

The second opening OPN2, which is illustrated as being in a plane form, may correspond to the plane form of the first opening OPN1. For example, in the case where the plane form of the first opening OPN1 is circular, the plane form of the second opening OPN2 may be configured in a circular form as well.

The plane form of the second opening OPN2 and the surface area of the second opening OPN2 as seen from a plan view may be changed depending on the plane form and the surface area of the first opening OPN1 as seen from a plan view. For example, the surface area of the second opening OPN2 when seen from a plan view may be greater than the surface area of the first opening OPN1 as seen from a plan view.

Furthermore, an edge of the second opening OPN2 may be spaced apart from its corresponding edge of the first edge OPN1 by as much as the second distance d2 along the first direction D1.

The operating circuit board PC1 coupled to one end of the display panel DSP and the touch circuit board PC2 coupled to one end of the touch sensing unit TSP may be bent in the rear surface direction of the display panel DSP together.

For example, in the case where the edge of the second opening OPN2 is not spaced apart from its corresponding edge of the first opening OPN1 in the first direction D1, due to the thickness of the first adhesive ADH1 and the touch sensing unit TSP disposed between a first flexible board and a second flexible board, the position of the first opening OPN1 of the bent operating circuit board PC1 and the position of the second opening OPN2 of the bent touch circuit board PC2 may not correspond to each other.

However, in the case where the edge of the second opening OPN2 is spaced apart from its corresponding edge of the first opening OPN1 by as much as the second distance d2 along the first direction D1 in consideration of the thickness of the first adhesive ADH1 and the touch sensing unit TSP, the position of the first opening OPN1 of the bent operating circuit board PC1 and the position of the second opening OPN2 of the bent touch circuit board PC2 may correspond to each other.

In an embodiment of the present disclosure, in the case where the edge of the second opening OPN2 is spaced apart from its corresponding edge of the first opening OPN1 by as much as the second distance d2 in the first direction D1, the position of the first opening OPN1 of the bent operating circuit board PC1 and the position of the second opening OPN2 of the bent touch circuit board PC2 may overlap each other. Electronic components may be inserted into or mounted onto the first opening OPN1 and the second opening OPN2, thereby providing an effect of efficiently using the inner space of the electronic device.

Explanation on the touch sensing unit TSP and the operating circuit board PC2 connected to the touch sensing unit TSP will be made later on with reference to FIGS. 5 to 7.

A touch control circuit board TPC may be coupled to the touch circuit board PC2. The touch control circuit board TPC may be disposed on the rear surface of the display panel DSP as the touch circuit board PC2 is bent.

The touch control circuit board TPC may include a touch control circuit (not illustrated) for operating the touch sensing unit TSP. For example, the touch control circuit may consist of an integrated circuit IC. The touch control circuit may generate an operating signal to the touch sensing structure, and receive a sensing signal from the touch sensing structure. Furthermore, using the operating signal and the sensing signal, the touch control circuit may determine whether or not a touch input has been made to the display device, the number of the touch inputs made, and a location of a touch input made and the like. The touch circuit board PC2 may be connected to the touch sensing unit TSP and to the touch control circuit board TPC to transmit the operating signal generated in the touch control circuit to the touch sensing structure, and transmit the signal output from the touch sensing structure to the touch control circuit board TPC. In an embodiment of the present disclosure, the touch control circuit board TPC may be formed as a flexible printing circuit board FPCB.

In an embodiment of the present disclosure, the touch circuit board PC2 and the touch control circuit board TPC are connected directly without overlapping each other at all, but without limiting the present disclosure. In other words, the touch circuit board PC2 and the touch control circuit board TPC may be connected to each other in various ways. For example, the touch circuit board PC2 and the touch control circuit board TPC may be connected to each other such that they overlap each other in a similar manner as the touch sensing unit TSP and the touch circuit board PC2, or using a connector and the like. Otherwise, the touch circuit board PC2 and the touch control circuit board TPC maybe integrally formed such that the touch circuit board PC2 and the touch control circuit board TPC cannot be separated from each other.

Hereinafter, explanation will be made on the display panel DSP and the operating circuit board PC1 in detail with reference to FIGS. 3 and 4.

Figure 3:
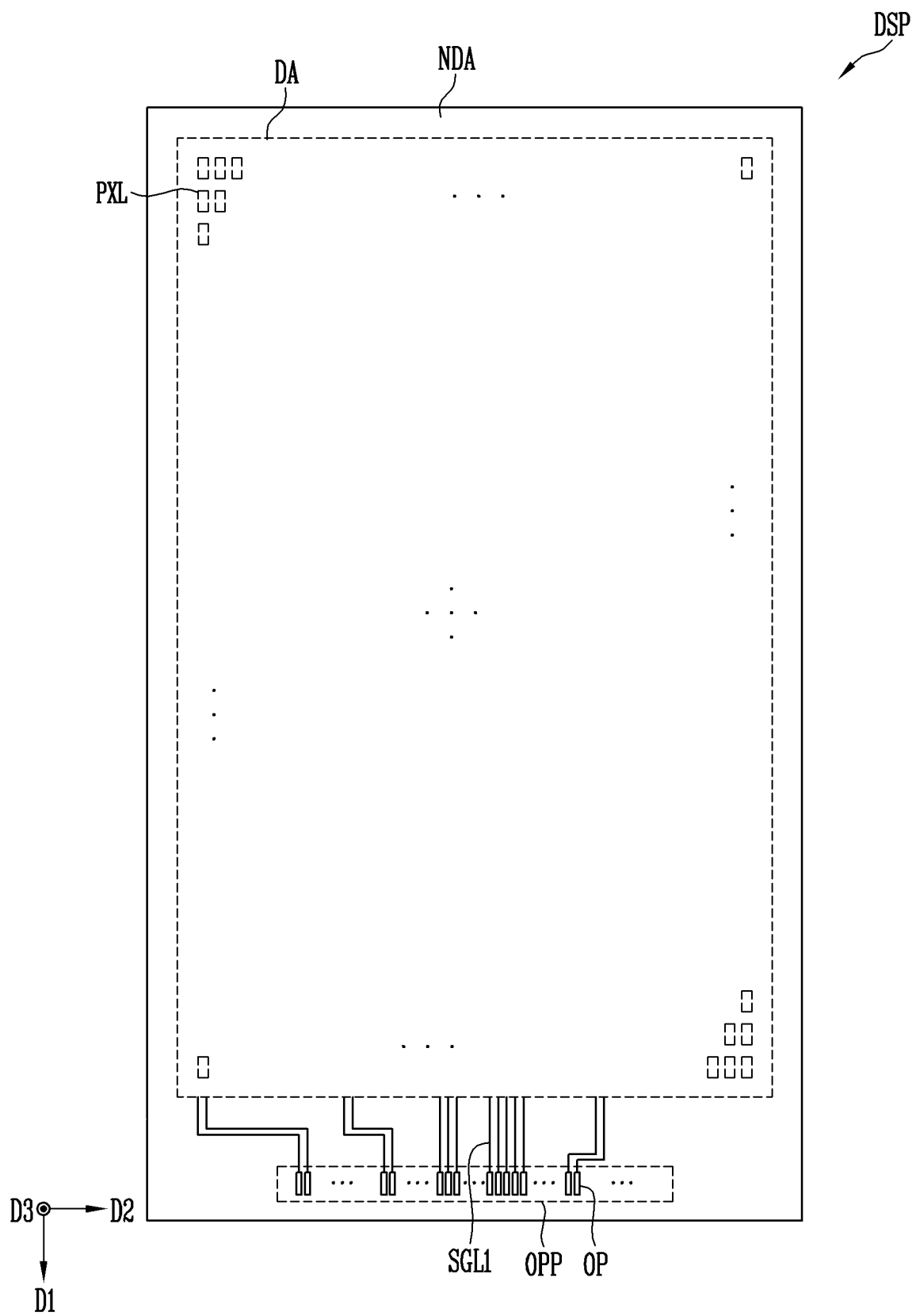
FIG. 3 is a plan view illustrating the display panel DSP in the display device according to the embodiment of the present disclosure.
Figure 4:
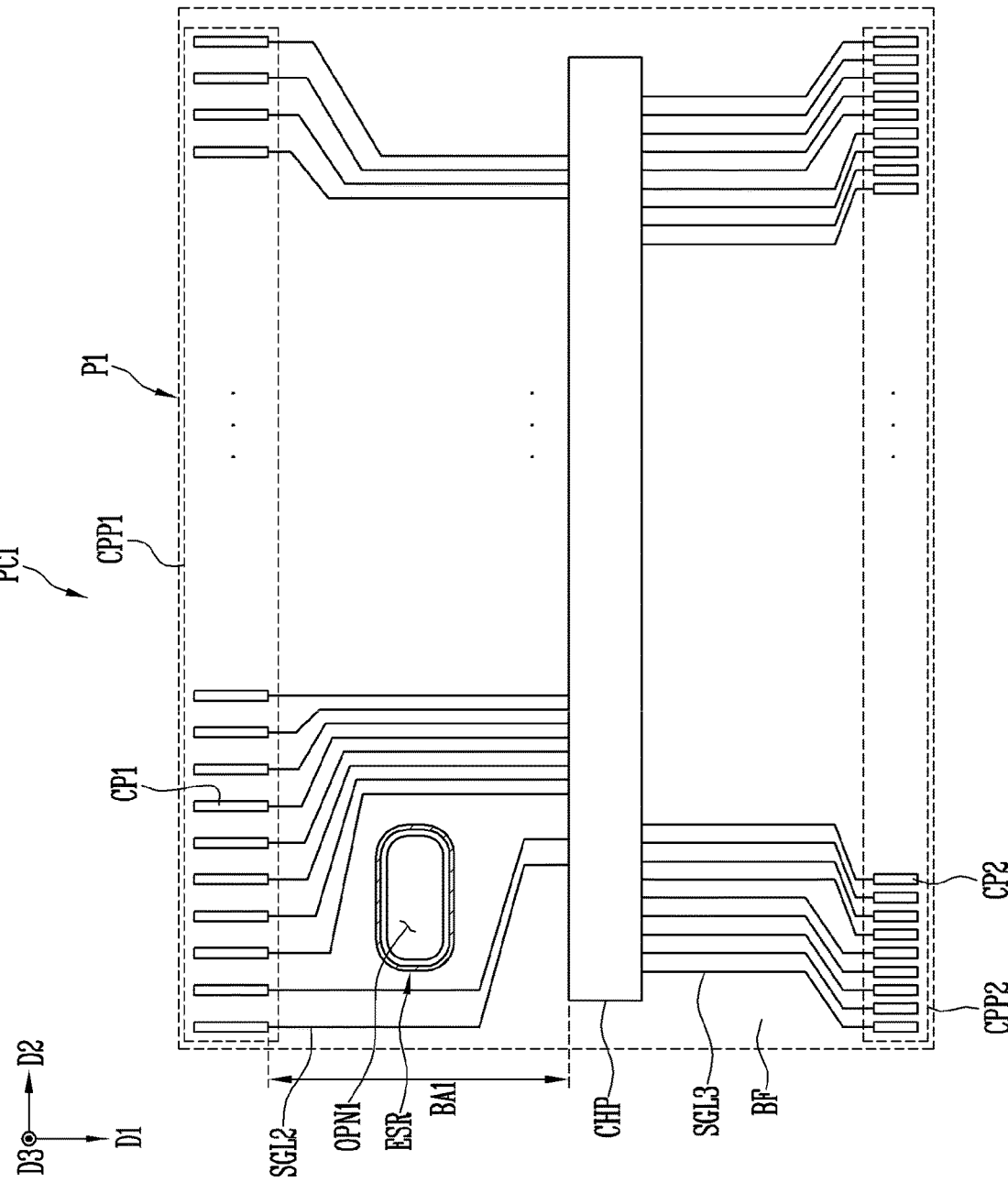
FIG. 4 is a plan view illustrating the operating circuit board in the display device according to the embodiment of the present disclosure, that is, a plan view corresponding to P1 of FIG. 2.

FIG. 3 is a plan view illustrating the display panel DSP in the display device according to the embodiment of the present disclosure, and FIG. 4 is a plan view illustrating the operating circuit board PC1 in the display device according to an embodiment of the present disclosure, corresponding to P1 of FIG. 2.

Referring to FIGS. 1 to 4, the display panel DSP includes the display area DA and the non-display area NDA provided on the periphery of the display area DA. The display area DA is an area where images are displayed and where a plurality of pixels PXL are provided. Examples of the images that may be displayed on the display area DA include arbitrary visual information such as a text, a video, a photograph, a 2-dimensional image or a 3-dimensional image, etc.

The pixels PXL may be provided as a plurality of pixels and be arranged in a matrix format. Each of the pixels PXL is illustrated as having a rectangular form, but without limiting the present disclosure. That is, the forms of the pixels PXL may vary. Furthermore, the pixels PXL may be provided such that they have different surface areas. For example, in the case of pixels PXL of different colors, the pixels PXL may have different surface areas and/or forms depending on the color of the pixels PXL.

In an embodiment of the present disclosure, each of the pixels PXL may be an organic light emitting element, but without limiting the present disclosure. For example, pixels PXL may include a liquid crystal display element, an electro-wetting display element, an electrophoresis display element, etc.

The non-display area NDA is provided on the periphery of the display area DA. In an embodiment of the present disclosure, the non-display area NDA may be formed at least at one side of the display area DA, and as illustrated (e.g., in FIG. 3), the non-display area NDA may be formed along the circumference of the display area DA. On the non-display area NDA, first signal lines SGL1 and the operating pad portion OPP connected to each of the pixels PXL are provided.

The first signal lines SGL1 may include scan lines for providing scan signals to the pixels PXL, data lines for providing data signals to the pixels PXL, and power lines for providing power to the pixels PXL, etc.

On the operating pad portion OPP, a plurality of operating pads OPs are provided each of which may be connected to at least one of the first signal lines SGL1. That is, at one end of each of the first signal lines SGL1, one of the operating pads OPs may be provided.

The operating circuit board PC1 is connected to a portion of the non-display area NDA of the display panel DSP. Specifically, the operating circuit board PC1 is connected to and overlaps a point where the operating pad portion OPP is provided in the non-display area NDA of the display panel DSP.

The operating circuit board PC1 includes a base film BF, a plurality of second and third signal lines SGL2 and SGL3, an electrostatic discharge ring ESR, a first connecting pad portion CPP1, a second connecting pad portion CPP2, and an integrated circuit chip CHP.

The base film BF may be a film having flexibility. The base film BF may be made of polyimide resin, epoxy resin, or another wellknown material having flexibility. On the base film BF, a plurality of second signal lines, an integrated circuit chip CHP, and the like may be formed.

The base film BF may include a first bending area BA1. The first bending area BA1 is an area of the base film BF that may be bent. The operating circuit board PC1 may be bent based on the first bending area BA1.

In the first bending area BA1, the first opening OPN1 that penetrates the base film BF may be positioned. Specifically, in the first bending area BA1, the first opening OPN1 for preventing a component such as an electronic component from contacting the base film BF may be formed. When the operating circuit board PC1 is bent, the electronic components of the electronic device may be positioned inside the first opening OPN1.

The electrostatic discharge ring ESR may be disposed on the circumference of the first opening OPN1. The electrostatic discharge ring ESR may be made of a metal material having a certain resistance, and may surround the first opening OPN1. The electrostatic discharge ring ESR may be grounded to prevent the operating circuit board PC1 from being damaged by the electrostatic energy being introduced to the first opening OPN1.

The second signal lines SGL2 and the third signal lines SGL3 may be disposed above the base film BF. The plurality of second signal lines SGL2 may be disposed in an area besides the area surrounding the first opening OPN1. The first opening OPN1 may be disposed between two neighboring second signal lines SGL2 from among the plurality of second signal lines SGL2.

The first connecting pad portion CPP1 is connected to an end of a second signal line SGL2 of the plurality of second signal lines SGL2 at the display panel DSP side, and the integrated circuit chip CHP is connected to another end of a second signal line SGL2 of the plurality of second signal lines SGL2 at the display panel DSP side. The first connecting pad portion CPP1 has a plurality of first connecting pads CP1, each of which is connected to at least one of the second signal lines SGL2.

The second connecting pad portion CPP2 is connected to an end of a third signal line SGL3 of the plurality of third signal lines SGL3 at the operating circuit board OPC side, and the integrated circuit chip CHP is connected to another end of a third signal line SGL3 of the plurality of third signal lines SGL3 at the operating circuit board OPC side. The second connecting pad portion CPP2 has a plurality of second connecting pads CP2, each of which is connected to at least one of the third signal lines SGL3.

The first connecting pad portion CCP1 is electrically connected to the operating pad portion OPP of the display panel DSP. Specifically, the first connecting pads CP1 of the first connecting pad portion CPP1 may each be connected to each of the operating pads OP of the operating pad portion OPP one by one. The first connecting pad portion CPP1 and the operating pad portion OPP may be connected to each other in various methods through a conductive member, for example, an anisotropic conductive film.

The second connecting pad portion CPP2 may be connected to the operating circuit board OPC. Although not illustrated, the operating circuit board OPC may have an additional pad portion that is connected to the second connecting pad portion CPP2. The operating circuit board OPC may be connected to the second connecting pad portion CPP2 in various methods through a conductive member, for example, an anisotropic conductive film or a connector, etc.

The second signal lines SGL2 connected to the first connecting pad portion CPP1 may extend from the first connecting pad portion CPP1 to the integrated circuit chip CHP via the first bending area BA1. The third signal line SGL3 connected to the second connecting pad portion CPP2 may extend from the second connecting pad portion CPP2 to the integrated circuit chip CHP. An electrical signal necessary for operating the display panel DSP may be generated in the operating circuit (not illustrated) and be transmitted to the display panel DSP through the plurality of second and third signal lines SGL2 and SGL3.

The first connecting pad portion CPP1 and the second connecting pad portion CPP2 may be terminals configured to control the electrical power of the operating circuit, and to input and/or output signals. For example, the first connecting pad portion CPP1 may be a signal output pad for transmitting a signal to a pixel PXL of the display panel DSP, and the second connecting pad portion CPP2 may be a signal input pad for receiving inputs of data and/or control signals from outside.

The integrated circuit chip CHP may receive data and control signals input from the operating circuit through the second and third signal lines SGL2 and SGL3 connected to the second connecting pad portion CPP2. The integrated circuit chip CHP may generate an operating signal using the data and control signals. The operating signal may be transmitted to the display panel DSP through the second and third signal lines SGL2 and SGL3 connected to the first connecting pad portion CPP1.

Hereinafter, detailed explanation will be made on the touch sensing unit TSP with reference to FIGS. 5A to 5C.

Figure 5A:
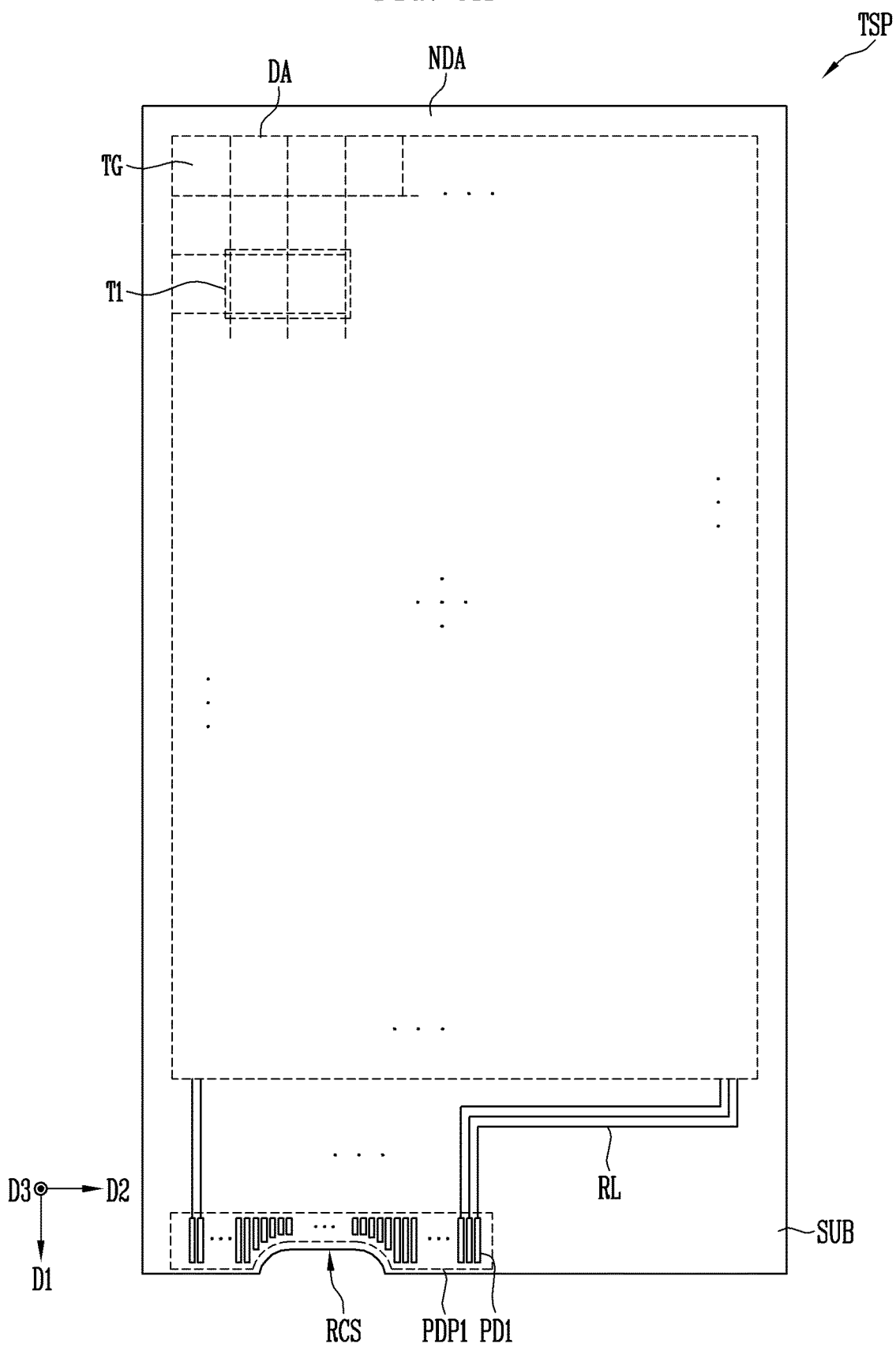
FIG. 5A is a plan view illustrating a touch sensing unit according to the embodiment of the present disclosure.
Figure 5B:
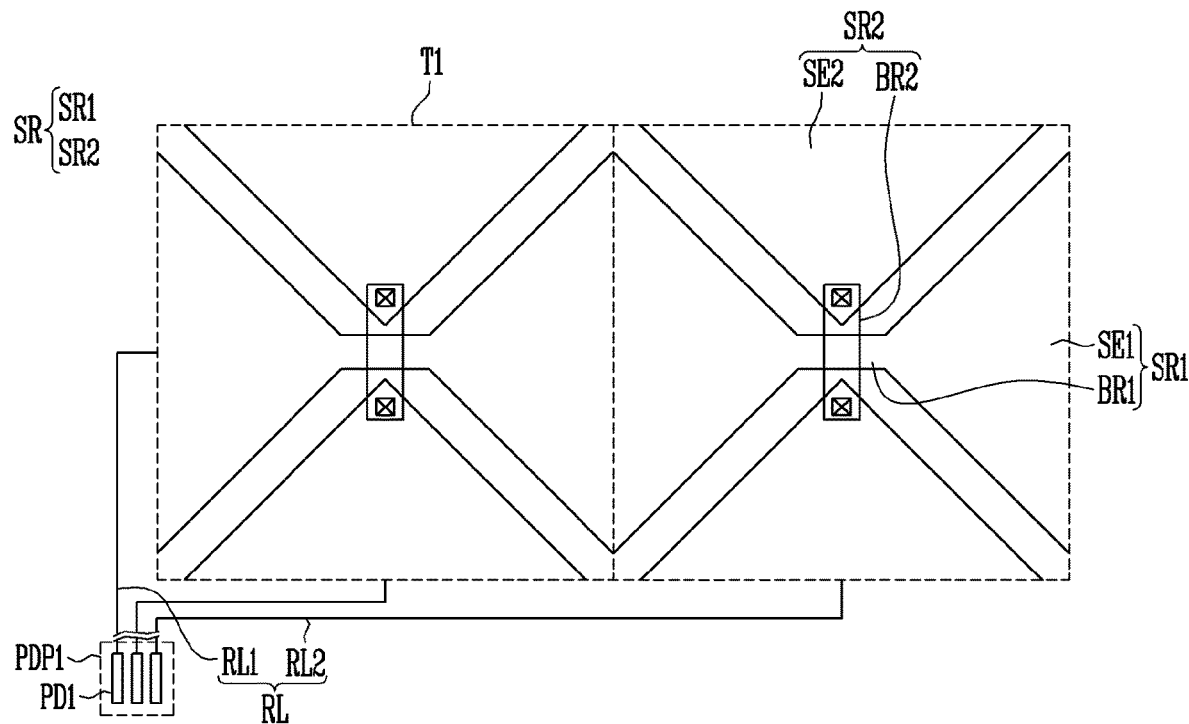
FIG. 5B is a plan view illustrating an area corresponding to T1 of FIG. 5A according to the embodiment of the present disclosure, where a touch sensing unit is embodied in a mutual capacitance method.
Figure 5C:
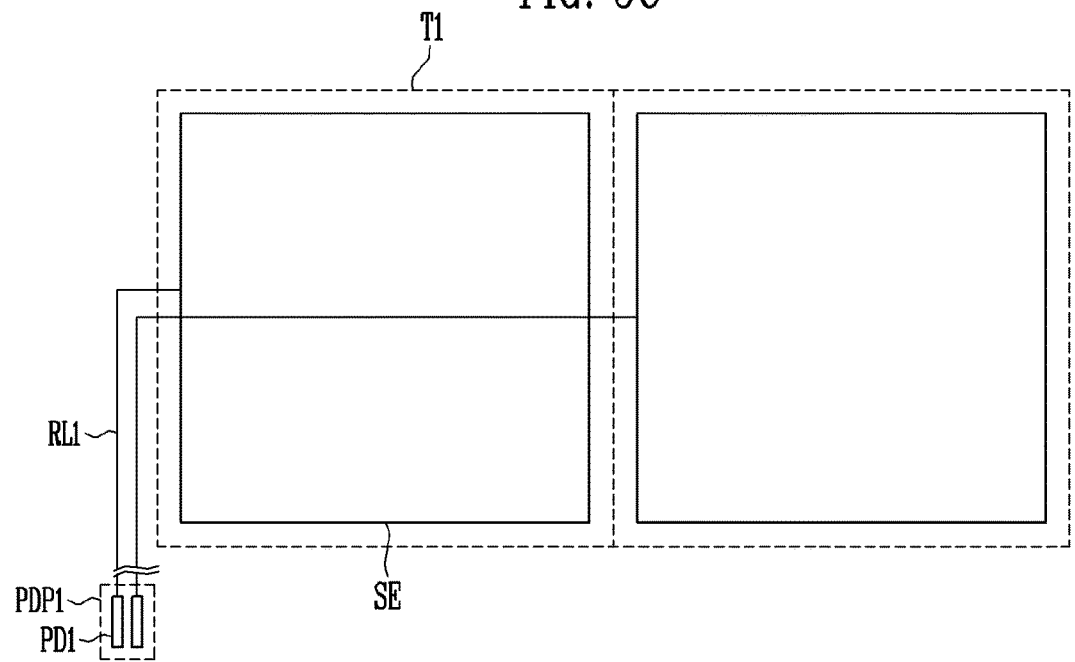
FIG. 5C is a plan view illustrating the area corresponding to T1 of FIG. 5A according to the embodiment of the present disclosure, where the touch sensing unit is embodied in a magnetic capacitance method.

FIG. 5A is a plan view illustrating the touch sensing unit TSP in the display device according to the embodiment of the present disclosure, FIGS. 5B and 5C are plan views illustrating an area corresponding to T1 of FIG. 5A according to the embodiment of the present disclosure, FIG. 5B is a plan view of a case where the touch sensing unit TSP is embodied in a mutual capacitance method, and FIG. 5C is a plan view of a case where the touch sensing unit TSP is embodied in a magnetic capacitance method.

First of all, referring to FIGS. 5A and 5B, the touch sensing unit TSP includes the touch area corresponding to the display area DA, and the non-touch area corresponding to the non-display area NDA. The touch area is an area where a touch may be recognized, and where a plurality of touch cells is provided. In the drawings, the touch area and the non-touch area are not illustrated additionally, but are illustrated as being the display area DA and the non-display area NDA, respectively.

The touch sensing unit TSP according to an embodiment of the present disclosure may be provided in various forms, for example, in a rectangular panel form having two pairs of sides, each pair of sides parallel to each other. The touch sensing unit TSP may be provided in a form and/or size corresponding to those of the display panel DSP.

The touch sensing unit TSP is not limited to the aforementioned form. For example, one side of the touch sensing unit TSP may be protruding or recessed. In an embodiment of the present disclosure, a line in the first direction D1 of the touch sensing unit TSP may or may not have a recess RCS of which a portion is inwardly recessed. In the case where there is such a recess RCS, the recess may correspond to the second opening OPN2 in the touch circuit board PC2 that will be explained hereinafter.

The touch sensing unit TSP includes a substrate SUB, a touch sensor SR provided on the substrate SUB, routing lines RL connected to the touch sensor SR, and the first pad portion PDP1 provided at one end of the routing lines RL.

The substrate SUB may be made of a transparent organic polymer, for example, polystyrene, polyvinylalcohol, polymethylmethacrylate, polyethersulfone, polyacrylate, polyetherimide, polyethylene naphthalate, polyethylene terephthalate, polypenylene sulfide, polyarylate, polyimide, polycarbonate, triacetate cellulose, and celluloseacetate propionate, etc. However, the substrate SUB may be made of other various materials, for example, fiber glass reinforced plastic FRP and the like.

The touch sensor SR is a component for sensing a touch made on the display panel DSP by the user and/or the pressure of the touch. The touch sensor SR is provided on the display area DA of the touch sensing unit TSP.

The touch sensor SR includes a plurality of first sensors SR1 that extend in the second direction D2 and to which a sensing voltage is applied, as well as a plurality of second sensors SR2 that extend in the first direction D1, which is different from the second direction D2. The first sensors SR1 are capacitance-coupled with the second sensors SR2, and this capacitance-coupling changes the voltage.

Each of the first sensors SR1 includes a plurality of first sensing electrodes SE1 aligned in the second direction D2 and a plurality of first bridges BR1 that connect the first sensing electrodes SE1 adjacent to each other. The first sensing electrodes SE1 may be provided in various polygonal forms that include square forms such as a rod, and trapezoid, etc.

In an embodiment of the present disclosure, the first sensing electrodes SE1 and the first bridges BR1 may be provided in a one-piece plate form or in a mesh form made of fine lines.

Each of the second sensors SR2 includes a plurality of second sensing electrodes SE2 aligned in the first direction D1 and a plurality of second bridges BR2 that connect the second sensing electrodes SE2 adjacent to each other. The second sensing electrodes SE2 may also be provided in various polygonal forms that include square forms such as a rod, a trapezoid, etc.

The second sensing electrodes SE2 and the second bridges BR2 may also be provided in a one-piece plate form or in a mesh form made of fine lines.

The first sensing electrodes SE1 and the second sensing electrodes SE2 may be arranged alternately in a matrix form.

The first sensor SR1 and the second sensor SR2 are insulated from each other. The first bridges BR1 and the second bridges BR2 are illustrated as crossing each other, but in fact they may be insulated from each other by having an insulating film therebetween. The first sensor SR1 and the second sensor SR2 may be provided on different films, but without limiting the present disclosure. In an embodiment of the present disclosure, the first sensing electrodes SE1 and the second sensing electrodes SE2 may be provided on a same film, and the first bridges BR1 and the second bridges BR2 may be provided on different films.

The routing lines RL are configured to connect the touch sensor SR to the touch circuit board PC2 that operates the touch sensor SR, and is provided in the non-display area NDA. The routing lines RL may transmit a sense input signal from the touch circuit board PC2 to the first sensors SR1 and to the second sensors SR2, and/or transmit a sense output signal from the first sensors SR1 and the second sensors SR2 to the touch circuit board PC2.

In an embodiment of the present disclosure, the routing lines RL may include a plurality of first routing lines RL1 and a plurality of second routing lines RL2. The first routing lines RL1 are connected to the first sensors SR1. Each of the first routing lines RL1 may be connected to a corresponding line of the first sensor SR1. The first routing lines RL1 may be offset a plurality of times within the non-display area NDA when seen from a plan view.

The second routing lines RL2 are connected to the second sensors SR2. Each of the second routing lines RL2 may be connected to a corresponding row of the second sensor SR2. The second routing lines RL2 may be offset a plurality of times within the non-display area NDA when seen from a plan view.

The first pad portion PDP1 is for transmitting a signal to the touch sensor SR or the touch circuit board PC2 between the touch sensor SR and the touch circuit board PC2. The first pad portion PDP1 is provided in the non-display area NDA.

The first pad portion PDP1 is connected to an end of the routing lines RL. The first pad portion PDP1 includes a plurality of first pads PD1 provided at the end of the routing lines RL.

In another embodiment of the present disclosure, the touch sensing unit TSP may be embodied in a magnetic capacitance method.

Referring to FIGS. 5A and 5C, the touch sensing unit TSP includes the sensing electrodes SE, routing lines RL connected to the sensing electrodes SE, and the first pad portion PDP1 provided at the end of the routing lines RL.

The sensing electrodes SE are aligned in a matrix form and a certain voltage is applied to the sensing electrodes SE.

The routing lines RL connect the sensing electrode SE to the touch circuit board PC2 that operates the sensing electrodes SE, and the routing lines RL are provided in the non-display area NDA. In an embodiment of the present disclosure, the routing lines RL and the sensing electrodes SE may be provided on a same layer. Alternatively, a portion or an entirety of the routing lines RL and a portion or an entirety of the sensing electrodes SE may be formed on different layers while having an insulating film therebetween.

The routing lines RL may transmit a sense input signal from the touch circuit board PC2 to the sensing electrodes SE or transmit a sense output signal from the sensing electrodes SE to the touch circuit board PC2.

A certain voltage may be applied to the sensing electrode SE through the routing line RL. When there is a touch made on the sensing electrode SE by the user, the capacitance of the sensing electrode SE of the touched area changes, which leads to a change in the voltage, and therefore, by obtaining the change of the certain voltage caused by the changed capacitance, it is possible to identify whether or not a touch has been made in that certain position.

Hereinafter, explanation will be made on the connection relationship between the touch sensing unit TSP and the touch circuit board PC2 according to an embodiment of the present disclosure with reference to FIGS. 6A to 6C and FIG. 7.

Figure 6A:
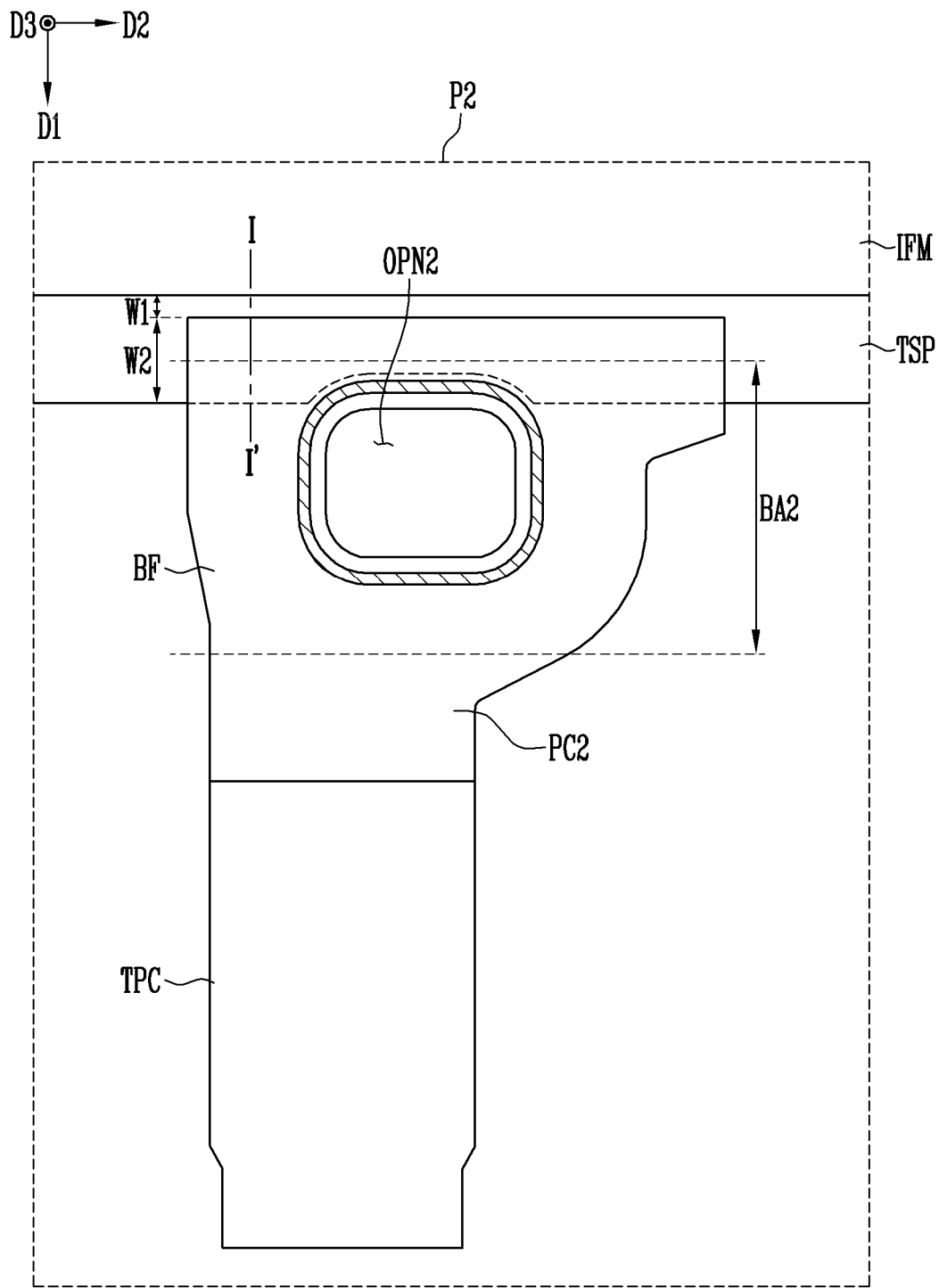
FIG. 6A is a plan view corresponding to P2 of FIG. 2, illustrating the form of connection between the touch sensing unit and the touch circuit board.
Figure 6B:
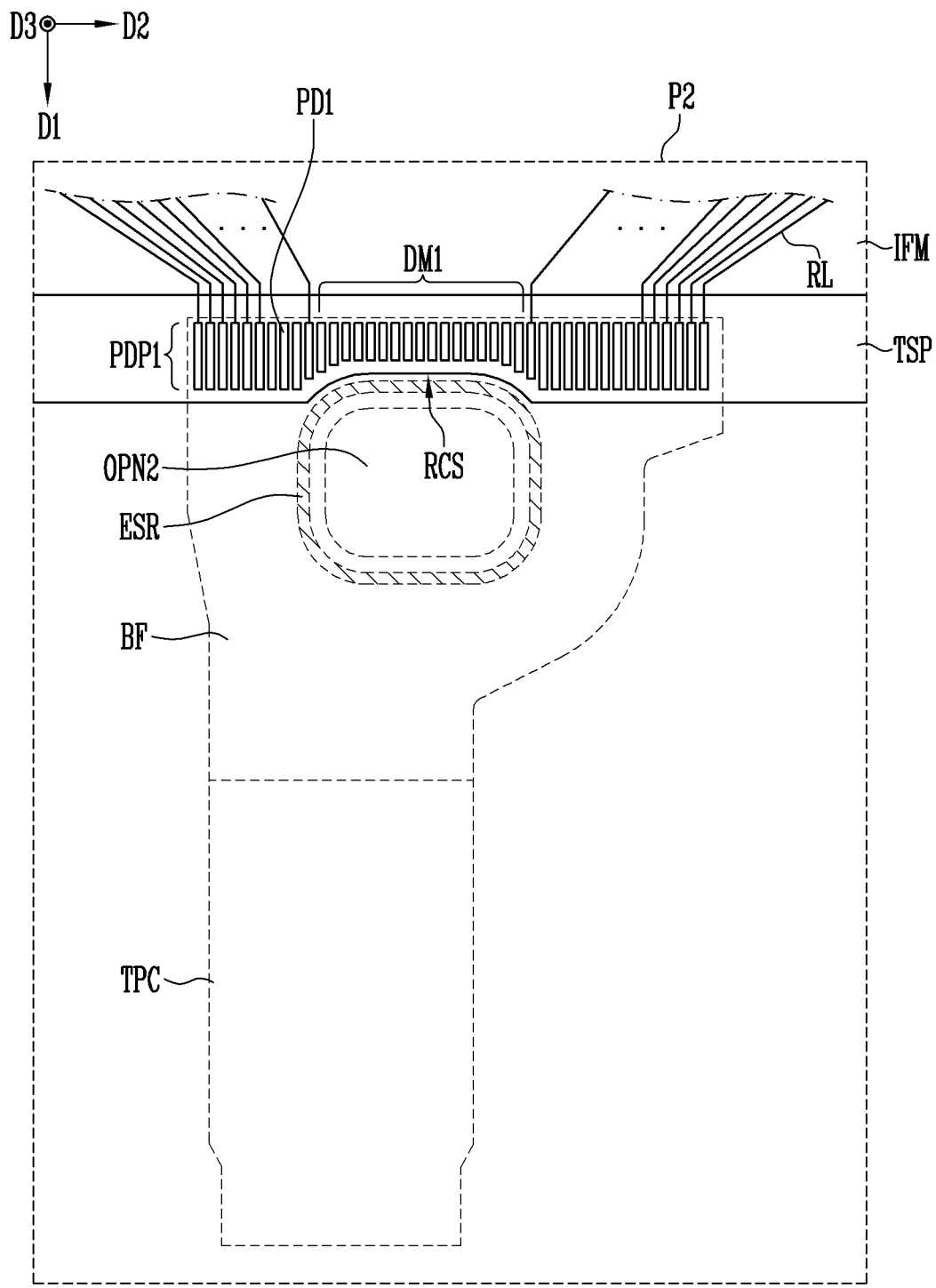
FIG. 6B is a plan view illustrating the touch sensing unit of FIG. 6A.
Figure 6C:
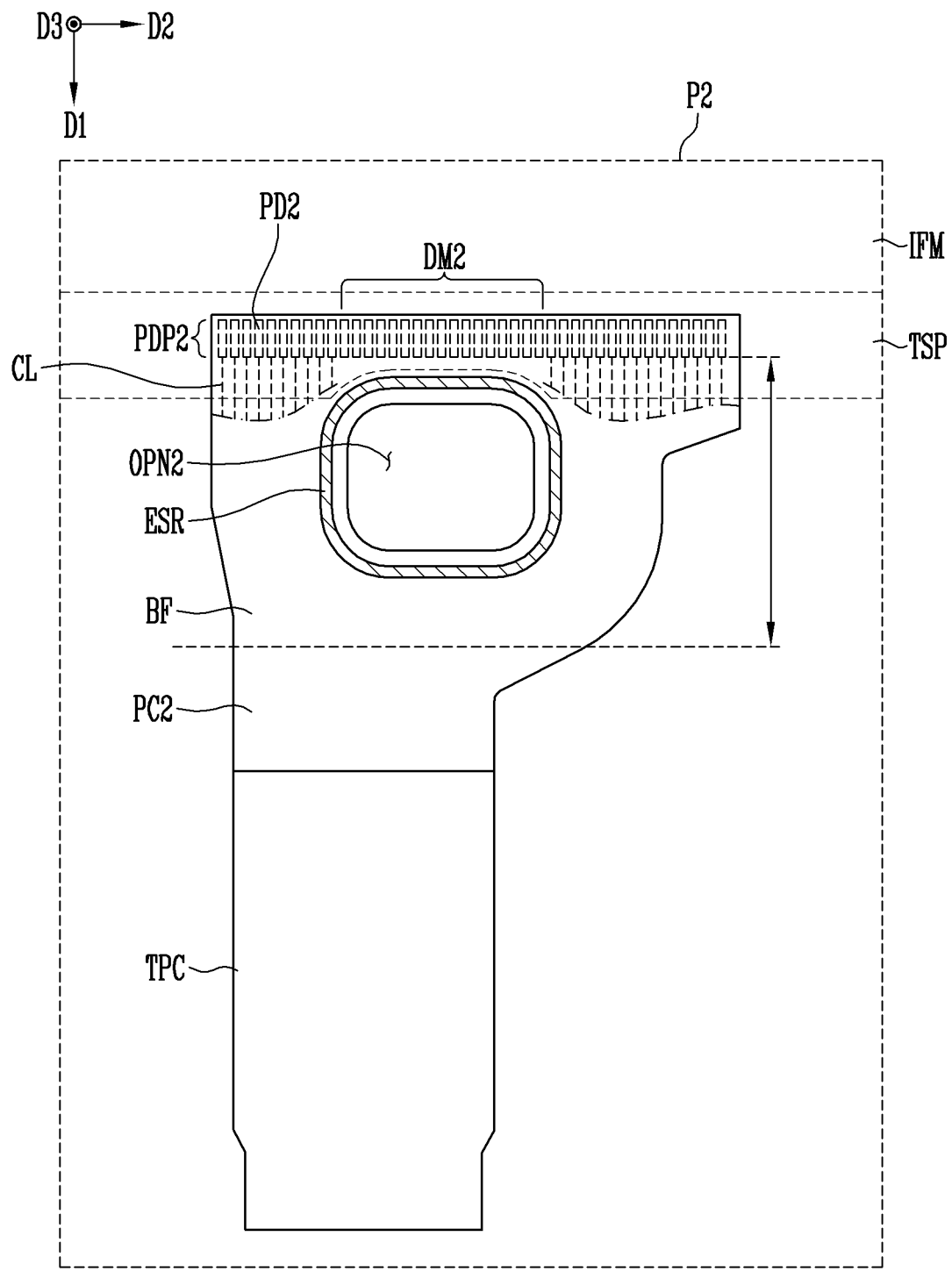
FIG. 6C is a plan view illustrating the touch circuit board of FIG. 6A.
Figure 7:
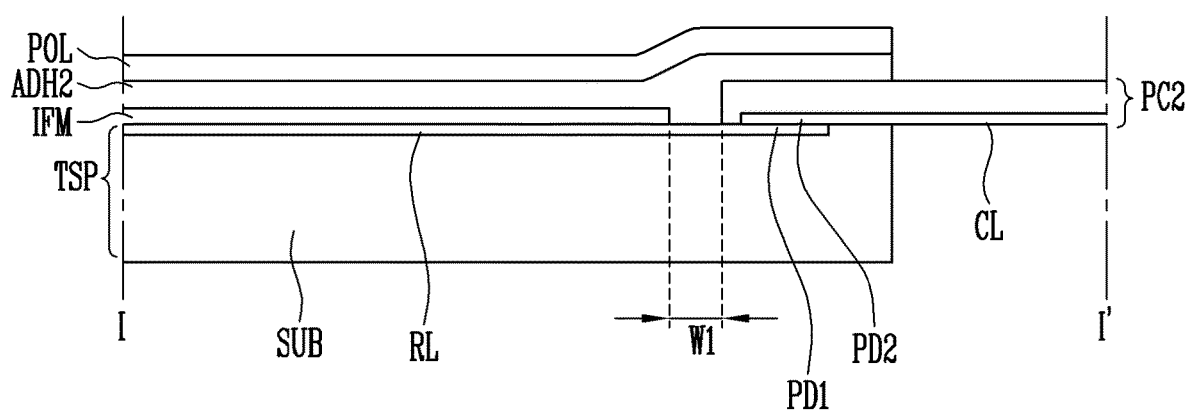
FIG. 7 is a cross-sectional view of FIG. 6A cut along line I-I'.

FIG. 6A is a plan view corresponding to P2 of FIG. 2. It is a plan view illustrating the form of connection between the touch sensing unit TSP and the touch circuit board PC2. FIG. 6B is a plan view illustrating the touch sensing unit TSP of FIG. 6A, FIG. 6C is a plan view illustrating the touch circuit board PC2 of FIG. 6A, and FIG. 7 is a cross-sectional view of FIG. 6A cut along line I-I'.

Referring to FIGS. 6A to 6C and FIG. 7, on the substrate of the non-display area NDA of the touch sensing unit TSP, the routing lines RL, and the first pad portion PDP1 disposed at one end of the routing lines RL are provided.

The routing lines RL and the first pad portion PDP1 may be provided in a thin film form on the substrate.

The touch circuit board PC2 may be coupled to one side of the touch sensing unit TSP. One end of the touch circuit board PC2 overlaps the touch sensing unit TSP when seen from a plan view.

In an area overlapping the touch circuit board PC2 in the non-display area NDA of the touch sensing unit TSP, the first pad portion PDP1 is provided. Each of the first pads PD1 of the first pad portion PDP1 may be connected to each of the routing lines RL provided on the touch sensing unit TSP. The first pad portion PDP1 may further include first dummy pads DM1 besides the first pads PD1. The first dummy pads DM1 are pads that are not connected to the routing lines RL. The first dummy pads DM1 may be provided in an area corresponding to the recess RCS. Otherwise, the first dummy pads DM1 may correspond to an area corresponding to the second opening OPN2 of the touch circuit board PC2.

The touch circuit board PC2 includes a base film BF, a plurality of connecting lines CL, an electrostatic discharge ring ESR, and a second pad portion PDP2.

The base film BF may be a film having flexibility. The base film BF may be made of polyimide resin, epoxy resin, or another well-known material having flexibility. On the base film BF, a plurality of connecting lines CL and an integrated circuit chip (not illustrated), etc. may be formed.

The base film BF may include a second bending area BA2. The second bending area BA2 is an area of the base film BF that may be bent. The touch circuit board PC2 may be bent based on the second bending area BA2.

In the second bending area BA2, the second opening OPN2 that penetrates the base film BF may be disposed. Specifically, in the second bending area BA2, the second opening OPN2 for preventing a component such as an electronic component from contacting the base film BF may be formed. When the touch circuit board PC2 is bent, the electronic components of the electronic device may be disposed inside the second opening OPN2.

The second opening OPN2 does not overlap the edge of the touch sensing unit TSP when seen from a plan view. The second opening OPN2 may be spaced apart from the edge of the touch sensing unit TSP in the first direction D1. The edge of the touch sensing unit TSP adjacent to the second opening OPN2 may have a straight line form that is generally parallel to the second direction D2 when seen from a plan view.

The electrostatic discharge ring ESR may be disposed on the circumference of the second opening OPN2. The electrostatic discharge ring ESR may be made of a metal material having a certain resistance, and may have a form surrounding the second opening OPN2. The electrostatic discharge ring ESR may be grounded to prevent the touch circuit board PC2 from being damaged by the electrostatic energy being introduced into the second opening OPN2.

This electrostatic discharge ring ESR may be electrically connected to the electrostatic discharge ring ESR disposed on the operating circuit board PC1. In this case, there may be a metal member (not illustrated) disposed between the operating circuit board PC1 and the touch circuit board PC2 to connect the electrostatic discharge rings ESR.

The plurality of connecting lines CL may be disposed above the base film BE The plurality of connecting lines CL may be disposed on an area besides the periphery of the second opening OPN2. The plurality of connecting lines CL may be formed such that the second opening OPN2 is disposed between two neighboring connecting lines CL from among the plurality of connecting lines CL.

The second pad portion PDP2 may be disposed at one end of the display panel DSP of the plurality of connecting lines CL. In an area that overlaps the touch sensing unit TSP of the touch circuit board PC2, the second pad portion PDP2 is provided. The second pad portion PDP2 overlaps the first pad portion PDP1, and each of the second pads PD2 of the second pad portion PDP2 may correspond to each of the first pads PD1 of the first pad portion PDP1 one by one.

The form and/or surface area of the first pads PD1 and the second pads PD2 may vary as long as each of the first pads PD1 and each of the second pads PD2 overlap each other and are connected to each other. The first pad portion PDP1 and the second pad portion PDP2 may be connected in various methods through a conductive member, for example, through an anisotropic conductive film.

The second pad portion PDP2 has second dummy pads DM2 corresponding to the first dummy pads DM1 of the first pad portion PDP1. The second dummy pads DM2 are not connected to the connecting lines CL.

The plurality of connecting lines CL may extend from the second pad portion PDP2 towards the touch control circuit board TPC direction via the second bending area BA2. An electrical signal necessary for operating the touch sensing unit TSP may be generated in the touch control circuit not illustrated, and be transmitted to the touch sensing unit TSP through the plurality of connecting lines CL.

The second pad portion PDP2 may be a terminal for inputting and/or outputting signals of the touch control circuit. For example, the second pad portion PDP2 includes a signal output pad for transmitting a signal to the touch sensing structure of the touch sensing unit TSP and a signal input pad for receiving input of a signal from the touch sensing structure.

The second dummy pads DM2 do not transmit an electrical signal necessary for operating the touch sensing unit TSP. The second dummy pads DM2 provide a function of being bonded to the touch sensing unit TSP. The existence of the second dummy pads DM2 strengthens the coupling force between the touch sensing unit TSP and the touch circuit board PC2.

In the second bending area BA2 of the touch circuit board PC2, the second opening OPN2 that penetrates the base film BF may be disposed, and the touch sensing unit TSP may have a recess RCS corresponding to the position and/or form of the second opening OPN2. It is illustrated that the touch sensing unit TSP has a recess RCS that is recessed in an opposite direction to the first direction D1 along the edge of the second opening OPN2 according to an embodiment of the present disclosure. The second opening OPN2 does not overlap the edge of the touch sensing unit TSP due to the recess RCS when seen from a plan view.

When the touch circuit board PC2 and the operating circuit board PC1 are bent, the second opening OPN2 and the first opening OPN1 may provide a space where electronic components of the electronic device may be inserted. Therefore, according to the embodiment of the present disclosure, the inner space of the electronic device is efficiently utilized.

On the touch sensing unit TSP, an insulating film IFM is provided. The insulating film IFM covers an upper surface of the touch sensing unit TSP. The insulating film IFM may be applied or laminated on the touch sensing unit TSP.

The insulating film IFM may have a substantially identical form as the touch sensing unit TSP, and may cover a portion of the touch sensing unit TSP other than the portion where the touch circuit board PC2 is attached. The insulating film IFM secures a connecting area with the second pad portion PDP2 of the touch circuit board PC2 by exposing the first pad portion PDP1 of the touch sensing unit TSP.

The insulating material IFM may be made of a transparent organic polymer, for example, polystyrene, polyvinylalcohol, polymethylmethacrylate, polyethersulfone, polyacrylate, polyetherimide, polyethylene naphthalate, polyethylene terephthalate, polypenylene sulfide, polyarylate, polyimide, polycarbonate, triacetate cellulose, and celluloseacetate propionate, etc.

In an embodiment of the present disclosure, the insulating film IFM is provided in a length that minimizes its distance from the touch circuit board PC2.

In an embodiment of the present disclosure, assuming that the width of the distance between the insulating film IFM and the touch circuit board PC2 is a first width W1, the smaller the first width, the better. In an embodiment of the present disclosure, the first width may be 0 to 0.2 mm, and in another embodiment of the present disclosure, the first width may be 0 to 0.1 mm. In the case where the first width W1 is 0, a side portion of the insulating film IFM and a side portion of the touch circuit board PC2 contact each other, and the insulating film IFM and the touch circuit board PC2 are not spaced apart from each other.

Although not illustrated, an insulating film may be disposed on an upper surface of the touch sensing unit TSP, that is, between the touch sensing unit TSP and the insulating film IFM. The insulating film may be an organic insulating film or an inorganic insulating film. The insulating film is formed such that it covers most of the upper surface of the first pad portion PDP1 of the touch sensing unit TSP, but that it has a contact hole that exposes an area of the first pads PD1 of the first pad portion PDP1. Accordingly, the insulating film may extend up to the portion where the touch circuit board PC2 is attached, and the extending portion may overlap a portion of the touch circuit board PC2. The insulating film is an organic insulating film, and may be formed on the touch sensing unit TSP in a laminating method. In an embodiment of the present disclosure, the width of the overlapping area of the insulating film and the touch circuit board PC2 may be about 0.5 mm. In this case, the distance between an end of the insulating film and the insulating film IFM may be about 0.5 mm.

On the insulating film IFM, the polarizing layer POL is provided having the second adhesive ADH2 between the insulating film IFM and the polarizing layer POL. The polarizing layer POL may cover the touch sensing unit TSP, the insulating film IFM provided on the touch sensing unit TSP, and a portion of the touch circuit board PC2. In an embodiment of the present disclosure, the polarizing layer POL may be provided in a substantially identical form and size as the touch sensing unit TSP, and the end of the touch sensing unit TSP and the end of the polarizing layer POL may coincide with each other.

In an embodiment of the present disclosure, the distance between the insulating film IFM and the touch circuit board PC2 either disappears or is minimized, thereby significantly reducing the defects of the touch sensing unit TSP.

The second adhesive ADH2 is provided on all of the upper surface of the insulating film IFM, on the upper surface of the touch circuit board PC2, and in the spaced apart space between the insulating film IFM and the touch circuit PC2. The insulating film IFM and the touch circuit board PC2 may have different thicknesses, in which case, a step may occur due to the height difference between the insulating film IFM and the touch circuit board PC2

According to conventional inventions, the greater the space between the insulating film IFM and the touch circuit board PC2, the higher the possibility that it may not be completely filled with the second adhesive ADH2, and thus bubbles may be generated in areas that are not filled with the second adhesive ADH2. As these bubbles are heated and thereby expand and move to other areas, especially to the display area DA that is within the visible view of the user, defects may occur. When these bubbles expand, the polarizing layer may come off.

After attaching the polarizing layer POL and the window WD, it is possible to carry out a heating process in order to remove initial bubbles generated between the touch sensing unit TSP and the polarizing layer POL, whereby most of the initial bubbles may be discharged outside. However, in the case where these initial bubbles are generated in an area where the touch circuit board PC2 is attached to the touch sensing unit TSP, the path through which these bubbles would otherwise be discharged may be blocked by the touch circuit board PC2, and thus as the bubbles expand between the insulating substrate and the touch circuit substrate PC2, the defect where the bubbles move to the adjacent display area DA as they expand may intensify.

On the other hand, according to an embodiment of the present disclosure, there may be no space or minimized space between the insulating film IFM and the touch circuit board PC2, whereby the possibility that the space may not be filled with the second adhesive ADH2 will decrease. Furthermore, even if bubbles are generated, they will be much smaller than in the conventional inventions. Thus, defects in the touch sensing unit TSP will decrease significantly even if the bubbles expand.

Under various conditions, except for the distance between the insulating film IFM and the touch circuit board PC2 being the same, the defect rates of a display device manufactured according to a comparative example according to a conventional invention and of a display device manufactured according to the embodiment of the present disclosure decreased significantly as follows.

The defect rates in the examples were measured based on the display area DA, except that if the distance from a point observable by the user's eye to the center of the bubbles was 0.6 mm or below, it was counted as a defect.

In the comparative example, the display device was manufactured such that the distance between the insulating film IFM and the touch circuit board PC2 is about 0.4 mm, whereas in an embodiment of the present disclosure, the distance between the insulating film IFM and the touch circuit board PC2 was maintained to be not more than about 0.1 mm.

Thereafter, the display device according to the aforementioned comparative example and the display device according to an embodiment of the present disclosure were kept under a pressure of 0.8 MPa at a temperature of 60° C. inside an autoclave for 15 minutes.

As a result, in the display device according to the comparative example, 1143 defective products were found from a total of 59764 samples; that is, about a 2.41% defect rate. On the other hand, in the display device according to an embodiment of the present disclosure, only 1 defective product was found from a total of 910 samples, showing a 0.11% defect rate.

According to an embodiment of the present disclosure, a high quality display device with significantly reduced defects of the touch sensing unit TSP is provided.

Figure 8:
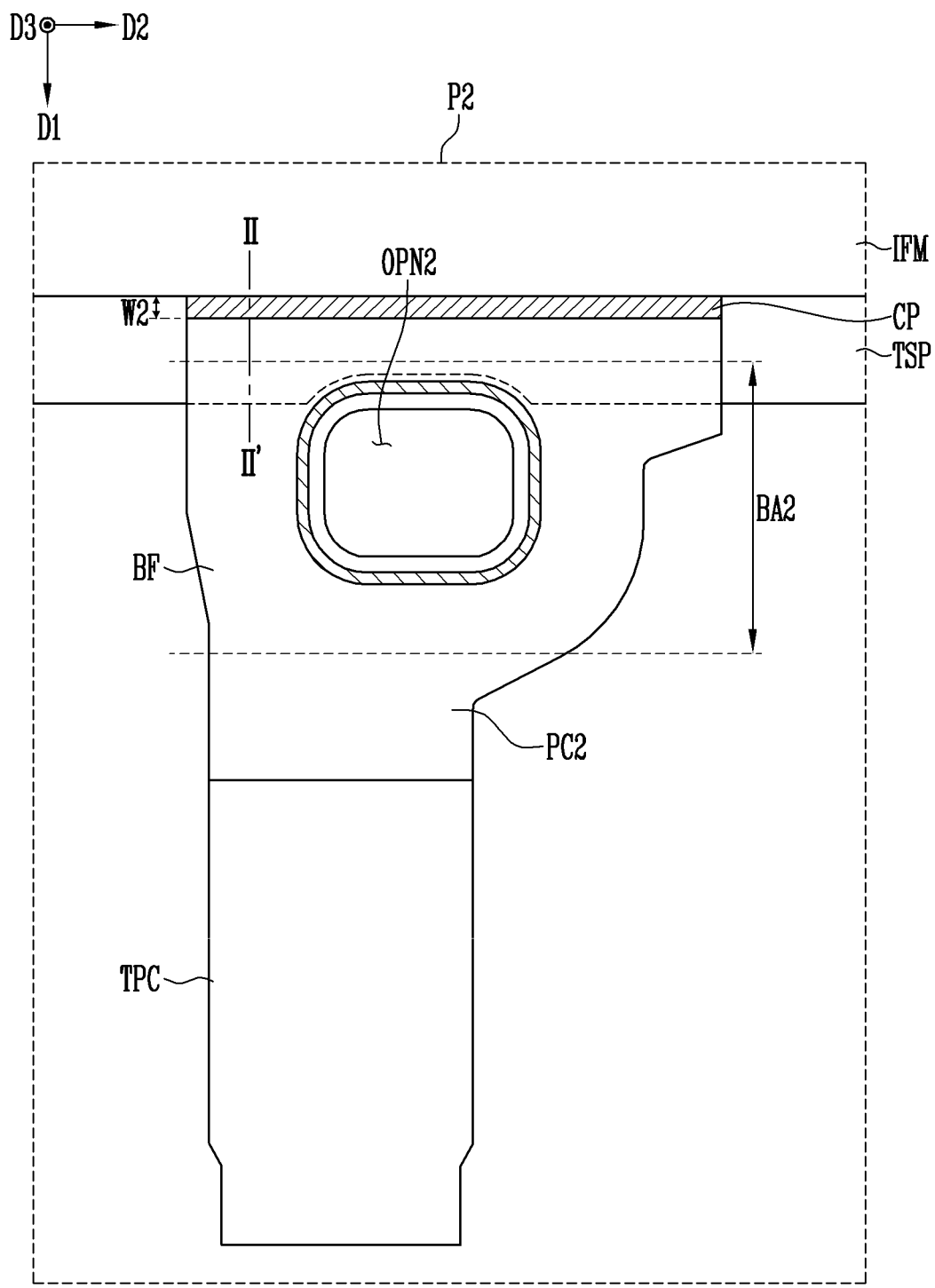
FIG. 8 is a plan view illustrating a display device according to another embodiment of the present disclosure.
Figure 9:
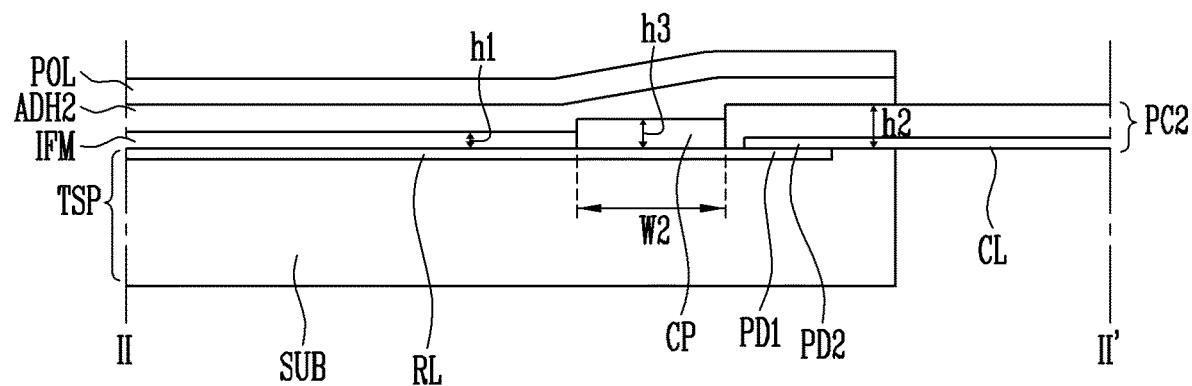
FIG. 9 is a cross-sectional view of FIG. 8 cut along line II-II'.

FIG. 8 is a plan view of a display device according to another embodiment of the present disclosure, and FIG. 9 is a cross-sectional view of FIG. 8 cut along line II-II'.

Hereinafter, explanation will be provided with the main focus on characteristics that are different from the aforementioned embodiments. For matters not described herein, the aforementioned embodiments or well known facts will apply.

Referring to FIGS. 8 and 9, on a board of a non-display area NDA of a touch sensing unit TSP, routing lines RL and a first pad portion PDP1 provided at one end of the routing lines RL are provided.

On the touch sensing unit TSP, an insulating film IFM that covers an upper surface of the touch sensing unit TSP is provided. The insulating film IFM covers the upper surface of the touch sensing unit TSP except for the area where the touch circuit board PC2 is attached. The insulating film IFM exposes the first pad portion PDP1 of the touch sensing unit TSP, thereby securing an area for connecting with the second pad portion PDP2 of the touch circuit board PC2.

In an embodiment of the present disclosure, a compensation pattern CP is provided between the insulating film IFM and the touch circuit board PC2. The compensation pattern CP is provided with a purpose to reduce or eliminate the distance between the insulating film IFM and the touch circuit board PC2 while also alleviating the step caused by the difference of height between the insulating film IFM and the touch circuit board PC2.

In an embodiment of the present disclosure, there is no limitation to the height of the compensation pattern CP as long as the step caused by the difference of height of the insulating film IFM and the height of the touch circuit board PC2 may be reduced. For example, assuming that the height of the insulating film IFM from the upper surface of the touch sensing unit TSP is a first height h1, the height of the touch circuit board PC2 is a second height h2, and the height of the compensation pattern CP is a third height h3, the height of the compensation pattern CP may be more than the first height h1 but less than the second height h2.

In an embodiment of the present disclosure, it is illustrated that the compensation pattern CP has a constant height, but there is no limitation thereto, and thus, the third height h3 of the compensation pattern CP in the touch circuit board PC2 direction from the insulating film IFM may be changed. For example, the third height h3 may be greater in the touch circuit board PC2 direction relative to the insulating film IFM direction.

The compensation pattern CP may be made of an organic polymer, the organic polymer being laminated between the insulating film IFM and the touch circuit board PC2.

In an embodiment of the present disclosure, assuming that the distance between the insulating film IFM and the touch circuit board PC2 is a second width W2, the second width W2 may be 0 to 0.1 mm as mentioned above, but since the step between the insulating film IFM and the touch circuit board PC2 may be compensated by the compensation pattern CP, the second width W2 may be greater than the aforementioned distance of 0 to 0.1 mm. That is, the distance between the insulating film IFM and the touch circuit board PC2 may be greater than the aforementioned 0 to 0.1 mm. For example, the second width W2 between the insulating film IFM and the touch circuit board PC2 may be about 0 to 0.4 mm.

The compensation pattern CP prevents or reduces the defect of the second adhesive ADH2 not being filled completely in the distance between the insulating film IFM and the touch circuit board PC2, and even if initial bubbles are generated between the insulating film IFM and the touch circuit board PC2, the initial bubbles may be easily discharged outside at the heating step, whereby the defect caused by the bubbles is significantly reduced.

Figure 10A:
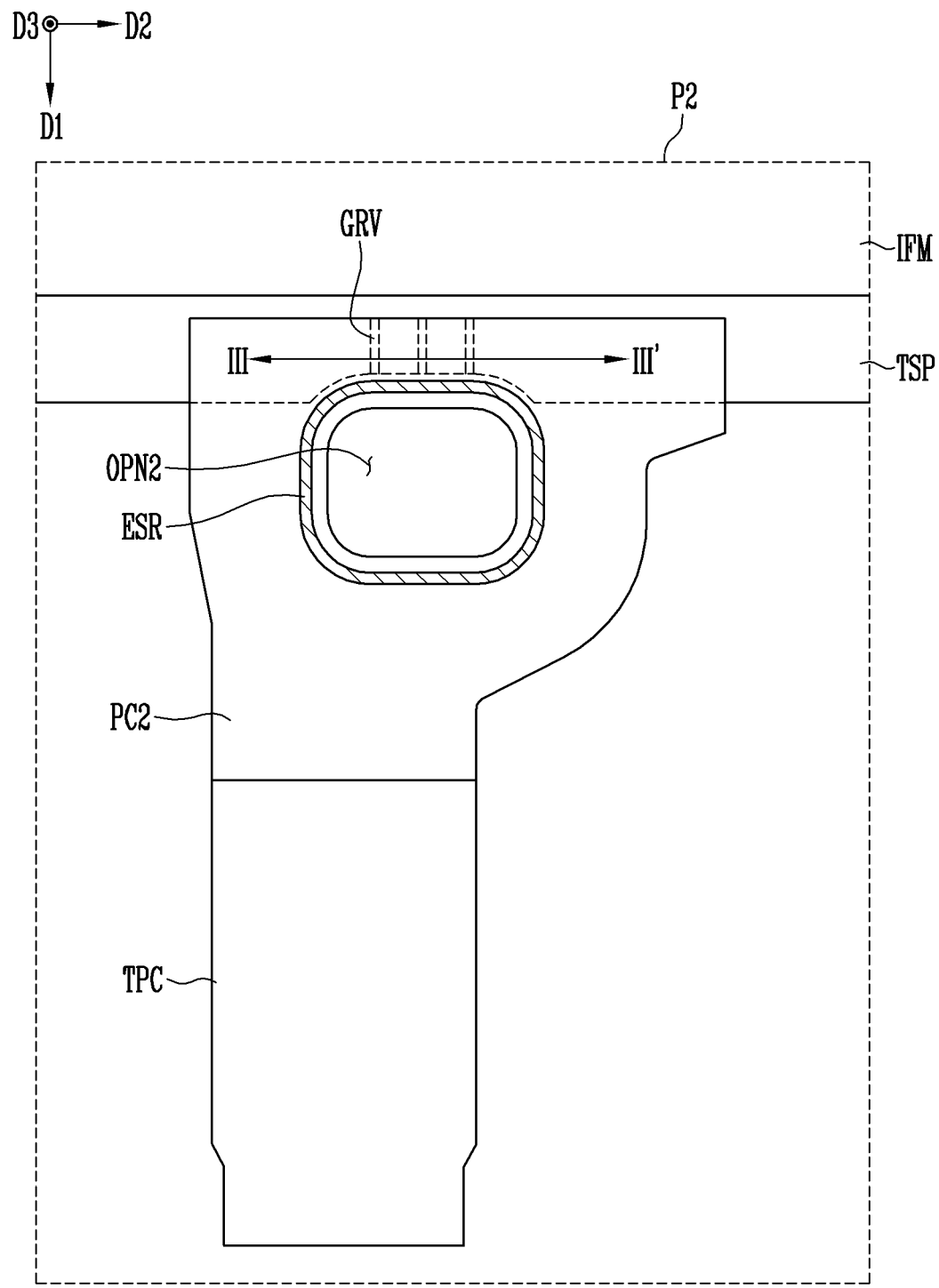
FIG. 10A is a plan view illustrating a display device according to another embodiment of the present disclosure.
Figure 10B:
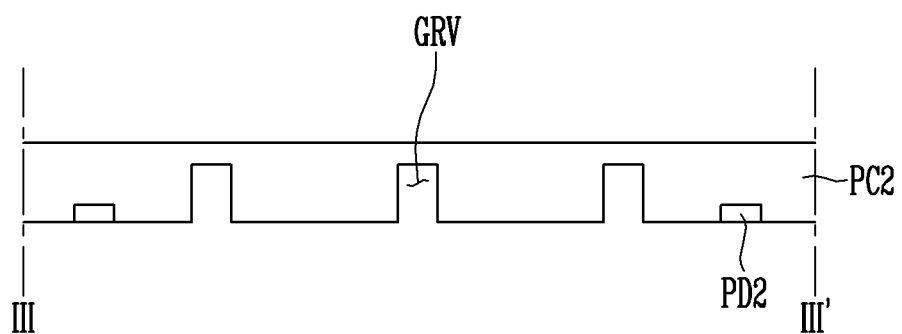
FIG. 10B is a cross-sectional view of FIG. 10A cut along line III-III'.

FIG. 10A is a plan view of a display device according to another embodiment of the present disclosure, and FIG. 10B is a cross-sectional view of FIG. 10A cut along line III-III'.

Referring to FIGS. 10A and 10B, on a board of a non-display area NDA of a touch sensing unit TSP, routing lines RL and a first pad portion PDP1 provided at an end of the routing lines RL are provided.

On the touch sensing unit TSP, an insulating film IFM for covering an upper surface of the touch sensing unit TSP is provided. In an embodiment of the present disclosure, the touch circuit board PC2 has a cavity that connects a side portion of the insulating film IFM with an external portion thereof.

The cavity may be a groove GRV formed on a lower surface of the touch circuit board PC2. That is, the cavity has a form recessed from the lower surface of the touch circuit board PC2 in the upper surface direction.

The groove GRV extends along the first direction D1 when seen from a plane view. The groove GRV may be provided to correspond to a portion where the touch circuit board PC2 and the touch sensing unit TSP overlap each other. In an embodiment of the present disclosure, the groove GRV has an inlet at the insulating film IFM side at the end of the touch circuit board PC2, and an inlet corresponding to an edge of the touch sensing unit TSP, thereby providing an air passage from between the insulating film IFM and the touch circuit board PC2 to the edge of the touch circuit board PC2.

In an embodiment of the present disclosure, the groove GRV may be formed such that it further extends from the second opening OPN2 of the touch circuit board PC2 to the end at the insulating film IFM side of the second touch circuit board PC2. In this case, the groove GRV provides an air passage from between the insulating film IFM and the touch circuit board PC2 to the second opening OPN2.

The groove GRV is provided in an area where the second dummy pads DM2 are provided. The second dummy pads DM2 are a portion that is not actually connected to the signal lines, and thus, even if the groove GRV is formed, there is no effect on a touch related signal.

The groove GRV may be provided such that it corresponds to a position spaced apart from both ends of the second opening OPN2 in the second direction D2 extending in the first direction D1 by about 0.4 mm or more.

In an embodiment of the present disclosure, it is illustrated that three grooves GRVs are provided, but the groove GRV may alternatively be provided in various numbers such as one, two, or more, etc. if necessary.

Accordingly, the groove GRV may serve as a discharging exit for bubbles that may be generated between the insulating film IFM and the touch circuit board PC2, so that even when the touch sensing unit TSP is heated, any gas expanded from the bubbles inside may be discharged outside through the groove GRV. Therefore, the defects of the touch sensing unit TSP caused by generation of bubbles between the insulating film IFM and the touch circuit board PC2 may be significantly reduced.

In the touch circuit board PC2, the form of the cavity connecting the side portion of the insulating film IFM with the exterior thereof may be implemented differently.

Figure 11A:
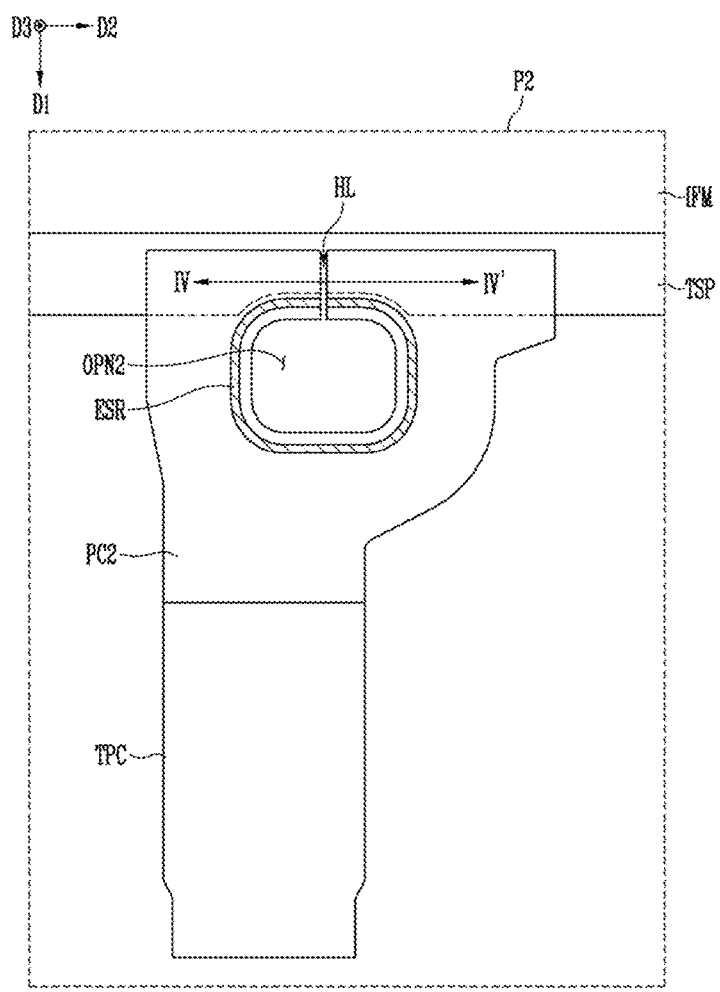
FIG. 11A is a plan view illustrating a display device according to another embodiment of the present disclosure.
Figure 11B:
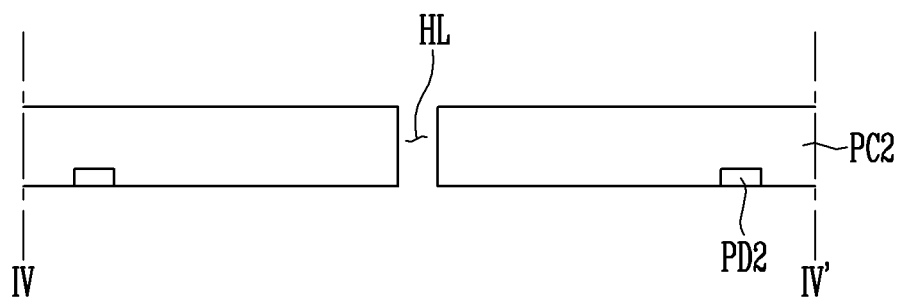
FIG. 11B is a cross-sectional view of FIG. 11A cut along line IV-IV'.

FIG. 11A is a plan view illustrating a display device according to another embodiment of the present disclosure, and FIG. 11B is a cross-sectional view of FIG. 11A cut along line IV-IV'.

In an embodiment of the present disclosure, the touch circuit board PC2 has a cavity that connects a side portion and an exterior of the insulating film IFM.

The cavity may be a hole HL that penetrates a lower surface and an upper surface of the touch circuit board PC2. That is, the cavity has a form of a hole that extends from the lower surface of the touch circuit board PC2 in the upper surface direction.

The hole HL may extend at length along the first direction D1 when seen from a plane, the hole HL being formed from the second opening OPN2 of the touch circuit board PC2 to the end at the insulating film IFM side of the second touch circuit board PC2. In the second pad portion PDP2, the hole HL is provided in an area where the second dummy pads DM2 are formed. The second dummy pads DM2 are a portion that is in fact not connected to signal lines, and thus even if the hole HL is formed, there is no effect on touch related signals.

The hole HL may be provided such that it corresponds to a position spaced apart from both ends of the second opening OPN2 in the second direction D2 extending in the first direction D1 by about 0.4 mm or more.

The hole HL provides an air passage from between the insulating film IFM and the touch circuit board PC2 to the second opening OPN2. Accordingly, the hole HL may serve as a discharging exit for bubbles that may be generated between the insulating film IFM and the touch circuit board PC2, so that even when the touch sensing unit TSP is heated, any gas expanded from the bubbles inside may be discharged outside through the hole HL. Therefore, the defects of the touch sensing unit TSP caused by generation of bubbles between the insulating film IFM and the touch circuit board PC2 may be significantly reduced.

In an embodiment of the present disclosure, it is illustrated that only one hole HL is provided, but alternatively, a plurality of such holes HLs may be provided if necessary.

In an embodiment of the present disclosure, the distance between the insulating film IFM and the touch circuit board PC2 may be 0 to 0.1 mm as aforementioned. In another embodiment of the present disclosure, since a cavity such as the groove or hole may be provided to prevent defects caused by bubbles, the distance may be greater than 0 to 0.1 mm. That is, the distance between the insulating film IFM and the touch circuit board PC2 may be even greater than the aforementioned distance of 0 to 0.1 mm. For example, the distance between the insulating film IFM and the touch circuit board PC2 may be about 0 to 0.4 mm.

Hereinafter, explanation will be made on positions of the display device and a camera inside an electronic device with reference to FIGS. 12 and 13.

Figure 12:
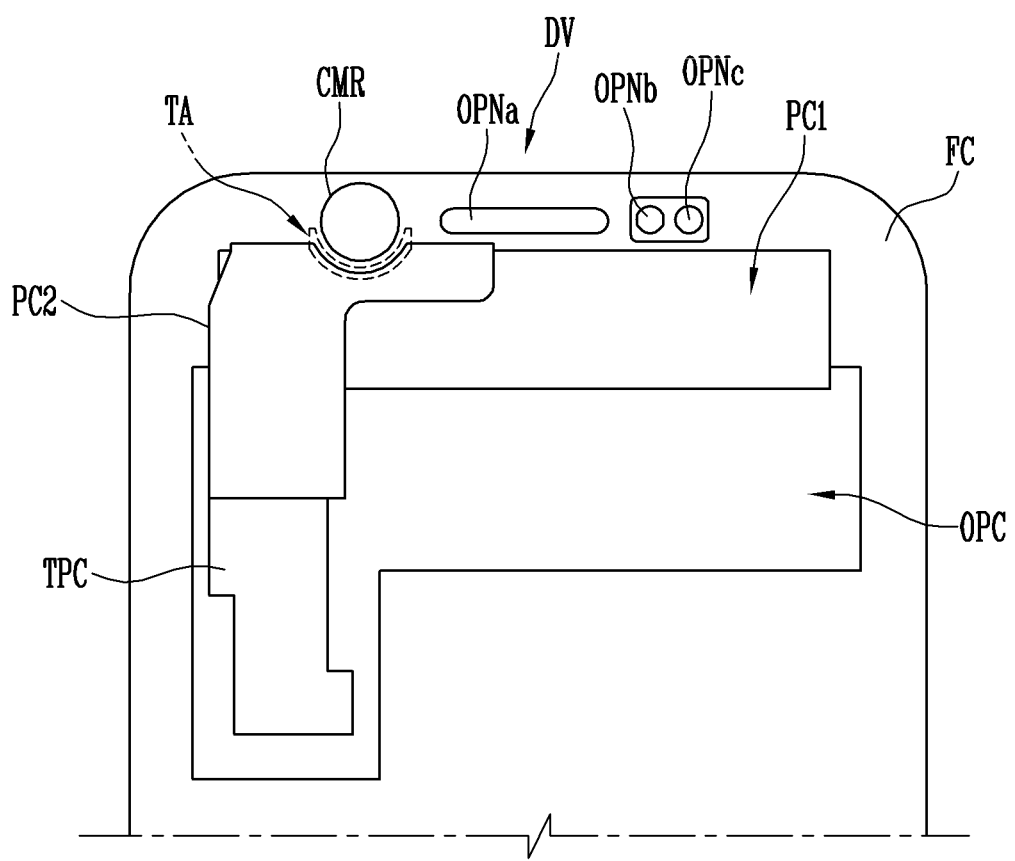
FIG. 12 is a plan view illustrating a portion of the electronic device according to the embodiment of the present disclosure.

FIG. 12 is a plan view illustrating a portion of the electronic device DV according to an embodiment of the present disclosure, and FIG. 13 is a view illustrating a portion of the display device and a position of the camera CMR according to the embodiment of the present disclosure.

The electronic device DV includes a case for example, a frame, a housing, a cover, etc. that constitutes its exterior. The electronic device DV may include a front case FC and a rear case not illustrated, and various types of electronic components may be arranged inside an internal space formed by the front case FC and the rear case.

Unlike the aforementioned example where a plurality of cases provide an inner space for accommodating various types of electronic components, the electronic device DV may be configured to have only one case that provides such an inner space. In such a case, the electronic device DV may be embodied as a uni-body device where synthetic resin or metal extends from its side surface to its rear surface.

A display device (not illustrated) is arranged on a front surface of a terminal body to output information. A window WD of the display device may be mounted onto the front case FC to form the front surface of the terminal body together with the front case FC.

Hereinafter, explanation will be made based on an assumption that a plurality of openings are formed in the front face FC of the electronic device DV to expose the display device, the camera CMR, a speaker, an illuminance sensor and a proximity sensor.

Referring to FIG. 12, the electronic device DV according to the embodiment of the present disclosure may include the front case FC, the display device mounted onto the front case FC, the operating circuit board PC1 connected to the display panel DSP, the operating circuit board OPC, the touch circuit board PC2 connected to the touch sensing unit TSP, the touch control circuit board TPC, and the camera CMR. Besides these, an opening OPNa for exposing the speaker, an opening OPNb for exposing the illuminance sensor, and an opening OPNc for exposing the proximity sensor may also be provided.

Referring to FIG. 13 as well, when the operating circuit board PC1 bends in the first bending area BA1, a groove is formed on a side surface of the bent operating circuit board PC1. For example, in the case where the plane form of the first opening OPN1 of the operating circuit board PC1 is a circle, when the operating circuit board PC1 is bent based on the first opening OPN1, the plane form of the first opening OPN1 is changed to a semi-circular form. That is, when seen from a direction parallel to the third direction D3, the first opening OPN1 of the bent operating circuit board PC1 is changed to a groove form.

The touch circuit board PC2 may be bent in a form such that it overlaps the operating circuit board PC1. Just as for the operating circuit board PC1, when the touch circuit board PC2 is bent in the second bending area BA2, a groove is formed on a side surface of the bent touch circuit board PC2.

The groove formed on the operating circuit board PC1 and the groove formed on the touch circuit board PC2 may overlap each other. In this case, the camera CMR may be formed within an area TA where the groove formed on the operating circuit board PC1 and the groove formed on the touch circuit board PC2 overlap each other.

That is, when the touch circuit board PC2 and the operating circuit board PC1 are bent, the second opening OPN2 and the first opening OPN1 may provide a space into which the camera CMR may be inserted. Therefore, in an embodiment of the present disclosure, there is an effect of efficiently utilizing the inner space of the mobile terminal DV.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skilled in the art that various changes in form and details may be made without departing from the spirit and scope of the present disclosure as set forth in the following claims.

What is claimed is:

1. A display device comprising:
    a display panel to display an image on a front surface of the display panel;
    a touch sensing unit provided on the display panel to sense a touch;
    an insulating film to cover an upper surface of the touch sensing unit;
    a first circuit board having at least one first opening, the first circuit board connected to the touch sensing unit;
    a compensation pattern provided between the insulating film and the first circuit board; and
    a polarizing layer to overlap the touch sensing unit and a portion of the first circuit board,
    wherein a height of the compensation pattern is larger than a height of the insulating film from the upper surface of the touch sensing unit, but is less than a height of the first circuit board.

2. The display device according to claim 1,
    further comprising an adhesive provided between the polarizing layer and the portion of the touch sensing unit and the first circuit board.

3. The display device according to claim 1,
    further comprising a second circuit board having a second opening, the second circuit board connected to the display panel.

4. The display device according to claim 3,
    wherein the first circuit board and the second circuit board have flexibility so that the first circuit board and the second circuit board are bent to be disposed on a rear surface of the display panel.

5. The display device according to claim 3,
    wherein the first opening and the second opening are provided in positions corresponding to each other.

6. The display device according to claim 1,
    wherein the touch sensing unit comprises:
    a substrate;
    a touch sensor provided on the substrate;
    a wiring connected to the touch sensor; and
    a first pad portion connected to the wiring,
    wherein the insulating film covers the touch sensor and the wiring.

7. The display device according to claim 6,
    wherein the first circuit board overlaps the first pad portion.

8. A display device comprising:
a display panel for displaying an image on a front surface of the display panel;
a touch sensing unit provided on the display panel to sense a touch;
an insulating film covering an upper surface of the touch sensing unit;
a first circuit board having a first opening and connected to the touch sensing unit and; and
a polarizing layer overlapping the touch sensing unit and a portion of the first circuit board,
wherein the first circuit board has a cavity, and the cavity has a form recessed from a surface of the first circuit board and extends from the first opening of the first circuit board to the insulating film.

9. The display device according to claim 8,
wherein the cavity is a groove formed on a lower surface of the first circuit board.

10. The display device according to claim 8,
wherein the cavity is a hole that penetrates an upper surface and a lower surface of the first circuit board.

11. The display device according to claim 8,
wherein the cavity comprises a plurality of cavities.

12. The display device according to claim 8,
wherein the substrate has a recess in a position corresponding to the first opening, and
wherein the first pad portion further comprises:
first pads provided at both sides of the recess; and
first dummy pads provided between the first pads provided at the both sides of the recess.

13. The display device according to claim 12,
wherein the first circuit board comprises a second pad portion corresponding to the first pad portion.

14. The display device according to claim 13,
wherein the second pad portion comprises second pads corresponding to the first pads provided at the both sides of the recess; and second dummy pads corresponding to the first dummy pads.

15. The display device according to claim 14,
wherein the cavity is provided between the second dummy pads.

* * * * *